United States Patent
Kanskar et al.

(10) Patent No.: US 10,763,640 B2
(45) Date of Patent: Sep. 1, 2020

(54) LOW SWAP TWO-PHASE COOLED DIODE LASER PACKAGE

(71) Applicant: nLIGHT, Inc., Vancouver, WA (US)

(72) Inventors: Manoj Kanskar, Portland, OR (US); Mark DeFranza, Vancouver, WA (US)

(73) Assignee: nLIGHT, Inc., Vancouver, WA (US)

( * ) Notice: Subject to any disclaimer, the term of this patent is extended or adjusted under 35 U.S.C. 154(b) by 59 days.

(21) Appl. No.: 15/961,750

(22) Filed: Apr. 24, 2018

(65) Prior Publication Data
US 2018/0309264 A1    Oct. 25, 2018

Related U.S. Application Data

(60) Provisional application No. 62/489,421, filed on Apr. 24, 2017.

(51) Int. Cl.
*H01S 5/024*    (2006.01)
*H01S 5/022*    (2006.01)
(Continued)

(52) U.S. Cl.
CPC ...... *H01S 5/02423* (2013.01); *H01S 5/02284* (2013.01); *H01S 5/4012* (2013.01); *H01S 5/005* (2013.01); *H01S 5/0071* (2013.01); *H01S 5/02216* (2013.01); *H01S 5/02252* (2013.01); *H01S 5/02469* (2013.01); *H01S 5/02492* (2013.01); *H01S 5/4056* (2013.01)

(58) Field of Classification Search
CPC ............. H01S 5/02423; H01S 5/02284; H01S 5/4012; H01S 5/4056; H01S 5/0071; H01S 5/02492; H01S 5/02252; H01S 5/02216; H01S 5/02469; H01S 5/005
See application file for complete search history.

(56) References Cited

U.S. PATENT DOCUMENTS

| | | | |
|---|---|---|---|
| 3,622,906 | A | 11/1971 | Nyul |
| 3,827,059 | A | 7/1974 | Rambauske |

(Continued)

FOREIGN PATENT DOCUMENTS

| | | |
|---|---|---|
| CN | 1829015 | 9/2006 |
| CN | 1975507 | 6/2007 |

(Continued)

OTHER PUBLICATIONS

Edwin, "Stripe Stacker for Use with Laser Diode Bars," Optics Letters, 20:222-224 (Jan. 15, 1995).

(Continued)

*Primary Examiner* — Yuanda Zhang
(74) *Attorney, Agent, or Firm* — Klarquist Sparkman, LLP

(57) ABSTRACT

Apparatus include a conductive block including a base surface and a plurality of parallel stepped surfaces opposite the base surface and defining respective mounting surfaces situated to receive respective laser diodes having respective thermal paths defining a common thermal path distance from the mounting surfaces to the base surface, and a two-phase cooling unit including a coupling surface attached to the base surface of the conductive block and wherein the two-phase cooling unit is situated to conduct heat generated through the emission of laser beams from the laser diodes along the thermal paths.

21 Claims, 15 Drawing Sheets

(51) Int. Cl.
*H01S 5/40* (2006.01)
*H01S 5/00* (2006.01)

(56) References Cited

U.S. PATENT DOCUMENTS

| | | | |
|---|---|---|---|
| 4,151,582 A | 4/1979 | Grunberger | |
| 4,550,333 A | 10/1985 | Ridder et al. | |
| 4,609,262 A | 9/1986 | Fujikawa et al. | |
| 4,689,482 A | 8/1987 | Horikawa et al. | |
| 4,716,568 A | 12/1987 | Scifres et al. | |
| 4,719,631 A | 1/1988 | Conaway | |
| 4,828,357 A | 5/1989 | Arata et al. | |
| 5,048,911 A | 9/1991 | Sang et al. | |
| 5,077,750 A | 12/1991 | Pocholle et al. | |
| 5,105,430 A | 4/1992 | Mundinger et al. | |
| 5,168,401 A | 12/1992 | Endriz | |
| 5,251,060 A | 10/1993 | Uenishi et al. | |
| 5,305,344 A | 4/1994 | Patel | |
| 5,319,528 A | 6/1994 | Raven | |
| 5,515,391 A | 5/1996 | Endriz | |
| 5,610,930 A | 3/1997 | Macomber et al. | |
| 5,668,822 A | 9/1997 | Tada | |
| 5,764,675 A | 6/1998 | Juhala | |
| 5,825,551 A | 10/1998 | Clarkson et al. | |
| 5,828,683 A * | 10/1998 | Freitas | H01S 5/02423 372/36 |
| 5,887,096 A | 3/1999 | Du et al. | |
| 5,898,211 A | 4/1999 | Marshall et al. | |
| 5,909,458 A | 6/1999 | Freitas et al. | |
| 5,986,794 A | 11/1999 | Krause et al. | |
| 5,987,043 A * | 11/1999 | Brown | H01S 5/02252 347/237 |
| 6,028,722 A | 2/2000 | Lang | |
| 6,041,072 A | 3/2000 | Ventrudo et al. | |
| 6,044,096 A | 3/2000 | Wolak et al. | |
| 6,057,871 A | 5/2000 | Peterson | |
| 6,075,912 A | 6/2000 | Goodman | |
| 6,115,185 A | 9/2000 | Du et al. | |
| 6,124,973 A | 9/2000 | Du et al. | |
| 6,212,310 B1 | 4/2001 | Waarts et al. | |
| 6,229,831 B1 | 5/2001 | Nightingale et al. | |
| 6,240,116 B1 | 5/2001 | Lang et al. | |
| 6,266,359 B1 | 7/2001 | Taheri et al. | |
| 6,324,320 B1 | 11/2001 | Goodman | |
| 6,327,285 B1 | 12/2001 | Wang | |
| 6,377,410 B1 | 4/2002 | Wang et al. | |
| 6,440,778 B1 | 8/2002 | Okada et al. | |
| 6,462,883 B1 | 10/2002 | Wang et al. | |
| 6,552,853 B2 | 4/2003 | Goodman | |
| 6,556,352 B2 | 4/2003 | Wang et al. | |
| 6,636,538 B1 | 10/2003 | Stephens | |
| 6,673,699 B2 | 1/2004 | Hubbard et al. | |
| 6,680,800 B1 | 1/2004 | Schreiber et al. | |
| 6,683,727 B1 | 1/2004 | Goring et al. | |
| 6,700,709 B1 | 3/2004 | Fermann | |
| 6,710,926 B2 * | 3/2004 | Beach | G02B 3/005 359/619 |
| 6,744,805 B2 | 6/2004 | Wang et al. | |
| 6,765,725 B1 | 7/2004 | Fermann et al. | |
| 6,778,732 B1 | 8/2004 | Fermann | |
| 6,898,222 B2 | 5/2005 | Hennig et al. | |
| 6,903,863 B1 | 6/2005 | Carniel et al. | |
| 6,972,827 B2 | 12/2005 | Mi | |
| 6,975,659 B2 | 12/2005 | Nagano et al. | |
| 7,420,996 B2 | 9/2008 | Schulte et al. | |
| 7,436,868 B2 | 10/2008 | Schulte et al. | |
| 7,443,895 B2 | 10/2008 | Schulte et al. | |
| 7,537,395 B2 | 5/2009 | Savage-Leuchs | |
| 7,586,963 B2 | 9/2009 | Schulte et al. | |
| 7,733,932 B2 | 6/2010 | Faybishenko | |
| 7,751,458 B2 | 7/2010 | Regaard et al. | |
| 7,764,723 B2 | 7/2010 | Ovtchinnikov et al. | |
| 7,817,361 B2 | 10/2010 | Mimura et al. | |
| 7,830,608 B2 | 11/2010 | Hu | |
| 7,848,372 B2 | 12/2010 | Schulte et al. | |
| 7,947,517 B2 | 5/2011 | Hisa | |
| 8,000,360 B2 | 8/2011 | Faybishenko | |
| 8,066,389 B2 | 11/2011 | Silverstein et al. | |
| 8,126,028 B2 | 2/2012 | Clifford, Jr. | |
| 8,339,598 B2 | 12/2012 | Ban et al. | |
| 8,427,749 B2 | 4/2013 | Du et al. | |
| 8,432,945 B2 * | 4/2013 | Faybishenko | G02B 6/4296 362/259 |
| 8,437,086 B2 | 5/2013 | Du et al. | |
| 8,488,245 B1 | 7/2013 | Chann | |
| 8,508,729 B2 | 8/2013 | Ban et al. | |
| 8,553,221 B2 | 10/2013 | Volodin et al. | |
| 8,599,485 B1 | 12/2013 | Cobb | |
| 8,654,326 B2 | 2/2014 | Volodin et al. | |
| 8,711,894 B2 | 4/2014 | Chuyanov et al. | |
| 8,830,587 B2 | 9/2014 | Bhatia et al. | |
| 8,842,369 B2 | 9/2014 | Li | |
| 8,861,082 B2 | 10/2014 | Cobb | |
| 8,873,134 B2 | 10/2014 | Price et al. | |
| 8,891,579 B1 | 11/2014 | Price et al. | |
| 8,942,521 B2 | 1/2015 | Song et al. | |
| 9,005,262 B2 | 4/2015 | Liu et al. | |
| 9,373,932 B2 | 6/2016 | Hayamizu et al. | |
| 9,413,136 B1 | 8/2016 | Vethake et al. | |
| 9,455,552 B1 | 9/2016 | Price et al. | |
| 9,705,289 B2 | 7/2017 | Kanskar et al. | |
| 9,720,145 B2 | 8/2017 | Kanskar | |
| 10,153,608 B2 | 12/2018 | Hemenway et al. | |
| 10,261,261 B2 | 4/2019 | Hemenway et al. | |
| 10,283,939 B2 | 5/2019 | Dawson et al. | |
| 2004/0114027 A1 | 6/2004 | Frith | |
| 2004/0252388 A1 | 12/2004 | Yamanaka et al. | |
| 2006/0165144 A1 | 7/2006 | Mikhailov et al. | |
| 2006/0280209 A1 | 12/2006 | Treusch | |
| 2007/0047401 A1 | 3/2007 | Sun | |
| 2007/0116071 A1 | 5/2007 | Schulte et al. | |
| 2007/0116077 A1 | 5/2007 | Farmer et al. | |
| 2007/0217467 A1 | 9/2007 | DeFranza et al. | |
| 2007/0217468 A1 | 9/2007 | DeFranza et al. | |
| 2007/0217469 A1 | 9/2007 | DeFranza et al. | |
| 2007/0217470 A1 | 9/2007 | DeFranza et al. | |
| 2007/0217471 A1 | 9/2007 | DeFranza et al. | |
| 2007/0236781 A1 | 10/2007 | Fidric | |
| 2007/0268572 A1 | 11/2007 | Hu | |
| 2007/0268945 A1 | 11/2007 | Schulte et al. | |
| 2007/0268946 A1 | 11/2007 | Schulte et al. | |
| 2007/0268947 A1 | 11/2007 | Schulte et al. | |
| 2008/0019010 A1 | 1/2008 | Govorkov et al. | |
| 2010/0158060 A1 | 6/2010 | Faybishenko | |
| 2010/0226405 A1 | 9/2010 | Chuyanov et al. | |
| 2010/0303110 A1 | 12/2010 | Venkata et al. | |
| 2011/0235669 A1 * | 9/2011 | Deri | H01S 5/02476 372/50.12 |
| 2012/0177074 A1 | 7/2012 | Liu et al. | |
| 2013/0146253 A1 * | 6/2013 | Daly | H05K 7/20281 165/80.4 |
| 2013/0148684 A1 | 6/2013 | Guo et al. | |
| 2013/0162956 A1 | 6/2013 | Okuda | |
| 2013/0194801 A1 | 8/2013 | Wolf et al. | |
| 2014/0036375 A1 | 2/2014 | Chann et al. | |
| 2014/0236022 A1 | 8/2014 | Zeng et al. | |
| 2014/0300971 A1 | 10/2014 | Wolak et al. | |
| 2015/0003484 A1 | 1/2015 | Muendel | |
| 2015/0055667 A1 | 2/2015 | Horn et al. | |
| 2015/0131692 A1 | 5/2015 | Hayamizu et al. | |
| 2015/0280404 A1 | 10/2015 | Kasai et al. | |
| 2015/0295386 A1 | 10/2015 | Hemenway et al. | |
| 2015/0349481 A1 * | 12/2015 | Kliner | H01S 3/0675 359/341.3 |
| 2016/0181764 A1 | 6/2016 | Kanskar et al. | |
| 2016/0322777 A1 | 11/2016 | Zediker et al. | |
| 2017/0271837 A1 | 9/2017 | Hemenway et al. | |
| 2018/0183214 A1 | 6/2018 | Dawson et al. | |
| 2018/0309264 A1 | 10/2018 | Kanskar et al. | |
| 2019/0212497 A1 | 7/2019 | Hemenway et al. | |

(56) References Cited

U.S. PATENT DOCUMENTS

| | | |
|---|---|---|
| 2019/0221990 A1 | 7/2019 | Hemenway et al. |
| 2019/0252863 A1 | 8/2019 | Chen et al. |

FOREIGN PATENT DOCUMENTS

| | | |
|---|---|---|
| CN | 101141051 | 3/2008 |
| CN | 101144909 | 3/2008 |
| CN | 201113224 | 9/2008 |
| CN | 101707326 | 5/2010 |
| CN | 201515142 | 6/2010 |
| CN | 102052608 | 5/2011 |
| CN | 102074896 | 5/2011 |
| CN | 102089943 | 6/2011 |
| CN | 102437509 | 5/2012 |
| CN | 202548385 | 11/2012 |
| CN | 202720390 | 2/2013 |
| CN | 203071399 | 7/2013 |
| CN | 103368066 | 10/2013 |
| CN | 103401136 | 11/2013 |
| EP | 0721113 | 7/1996 |
| JP | 2008-109083 | 5/2008 |
| RU | 2010143026 | 4/2012 |
| WO | WO 2005059626 | 6/2005 |
| WO | WO 2009/151558 | 12/2009 |
| WO | WO 2018/119125 | 6/2018 |

OTHER PUBLICATIONS

International Search Report and Written Opinion for International Application No. PCT/US2015/019288, dated Jun. 10, 2015.

International Search Report and Written Opinion from International Application No. PCT/US2017/018210, dated May 8, 2017, 12 pages.

International Search Report and Written Opinion for related International Application No. PCT/US2017/023067, 12 pages, dated Jun. 27, 2017.

Lens Cell, Crossed Cylinders, Pearl Drawing, 1 page (Feb. 22, 2007).

International Search Report and Written Opinion for related International Application No. PCT/US2018/029222, 6 pages, dated Aug. 9, 2018.

International Preliminary Report on Patentability from International Application No. PCT/US2017/018210, dated Aug. 21, 2018, 8 pages.

* cited by examiner

400

LOW SWAP TWO-PHASE COOLED DIODE LASER PACKAGE

CROSS-REFERENCE TO RELATED APPLICATIONS

This application claims the benefit of U.S. provisional application 62/489,421, which is incorporated by reference herein.

FIELD

The disclosure pertains to laser diode packages and laser diode package thermal management.

BACKGROUND

Modern industrial lasers use semiconductor devices to provide energy directly to manufacturing targets or as pump sources for solid state lasers. However, laser diodes are generally assembled in protective packages to protect the device from damage due to thermal and mechanical stress, corrosion, contamination, etc. Semiconductor laser packages may be passively cooled or actively cooled using various heat dissipation components such as heat dissipation layers, heat spreaders, and/or heat sinks.

However, many applications for laser diode packages may require extreme size, weight, and power requirements that generally render laser diode packages, or even laser diodes, unsuitable for the application. Particularly, approaches that might address such requirements stand in direct tension with laser diode and laser diode package reliability and power capabilities. Therefore, a need remains for laser diode packages with improved size, weight, and power characteristics.

SUMMARY

According to an aspect of the disclosed technology, apparatus include a conductive block including a base surface and a plurality of parallel stepped surfaces opposite the base surface and defining respective mounting surfaces situated to receive respective laser diodes having respective thermal paths defining a common thermal path distance from the mounting surfaces to the base surface, and a two-phase cooling unit including a coupling surface attached to the base surface of the conductive block and wherein the two-phase cooling unit is situated to conduct heat generated through the emission of laser beams from the laser diodes along the thermal paths.

In some embodiments, the base surface forms a sealing surface of an opening in a cooling chamber of the two-phase cooling unit and the heat is conducted directly to the cooling chamber through the base surface.

In some embodiments, the coupling surface is attached to the base surface along one or more of the thermal paths.

In some examples, the laser diodes on the mounting surfaces emit the laser beams along respective parallel emission axes in a common direction and a common plane that is parallel to the base surface. In selected examples, the mounting surfaces are situated at a first edge of the conductive block and the common direction is away from the first edge towards a second edge opposite the first edge. In some embodiments, the plurality of parallel stepped surfaces correspond to a first plurality and the conductive block includes a second plurality of the parallel stepped surfaces that is situated at the second edge and the common direction associated with the second plurality is away from the second edge and opposite the common direction associated with the first plurality.

In some examples, the conductive block is a first conductive block, and the coupling surface is a first coupling surface, and the apparatus further includes a second conductive block including a base surface and a plurality of parallel stepped surfaces opposite the base surface and defining respective mounting surfaces situated to receive respective laser diodes having respective thermal paths defining a common thermal path distance from the mounting surfaces to the base surface, wherein the base surface of the second conductive block is attached to a second coupling surface of the two-phase cooling unit that is opposite the first coupling surface.

In selected examples, the conductive block is made of first conductive material and includes a removable insert made of a second conductive material that is more conductive than the first conductive material and that is situated along the thermal paths. In some of such examples, the first conductive material is aluminum and the second conductive material is copper.

In some embodiments, the conductive block includes a plurality of stepped mounting block surfaces situated to receive respective stepped mounting blocks, each stepped mounting block including a plurality of the parallel stepped surfaces.

In further embodiments, the laser beams have fast axes and slow axes mutually perpendicular to each other and to the emission axes, wherein the fast axes correspond to a fast beam divergence associated with a thickness of an emission region of the laser diodes in a corresponding semiconductor growth direction. In selected examples, apparatus further include a plurality of groups of slow axis collimators and turning mirrors, each group situated on a respective surface parallel or common to a respective one of the mounting block surfaces, wherein the turning mirrors are situated to reflect the laser beams into a common stack propagation direction having the emission axes and the fast axes forming a common stacking plane. In some examples, apparatus include an optical fiber and coupling optics situated to receive the laser beams from the common stack propagation direction and to couple the laser beams into an end of the optical fiber. In some examples, an NA of the optical fiber is underfilled with respect to the NA of the laser beams directed into the end of the optical fiber such that the end of the optical fiber and a fiber termination housing that surrounds the end of the optical fiber are not directly coupled to a cooling channel of the two-phase cooling unit. In some embodiments, an optical axis of the optical fiber is situated at an oblique angle with respect to the base surface corresponding to an angle between the parallel stepped surfaces and the base surface.

In some examples, the common thermal path distance corresponds to a thermal resistance of 1.5° C./W or smaller. In selected examples, the base surface and coupling surface form a brazed attachment. In particular examples, apparatus include a laser diode package having a volume/power ratio of 0.4 cm$^3$/W or smaller, a mass/power ratio 0.5 g/W or smaller, and a fiber-coupled output power of 500 W or greater. In specific examples, the volume/power ratio is 0.2 cm$^3$/W or smaller and the fiber-coupled output power is at least 1000 W.

In some embodiments, apparatus include a plurality of laser diode packages, each including an apparatus that has a conductive block that includes a base surface and a plurality of parallel stepped surfaces opposite the base surface and defining respective mounting surfaces situated to receive respective laser diodes having respective thermal paths defining a common thermal path distance from the mounting surfaces to the base surface, and that has a two-phase cooling unit that includes a coupling surface attached to the base surface of the conductive block and wherein the two-phase cooling unit is situated to conduct heat generated through the emission of laser beams from the laser diodes along the thermal paths, and further including a fused fiber combiner situated to combine fiber-coupled outputs of the laser diode packages.

In some examples, apparatus include a lid attached to the two-phase cooling unit and situated to enclose the laser diodes and the plurality of parallel stepped surfaces of the conductive block.

The foregoing and other objects, features, and advantages of the disclosed technology will become more apparent from the following detailed description, which proceeds with reference to the accompanying figures.

DETAILED DESCRIPTION

Figure 1A:
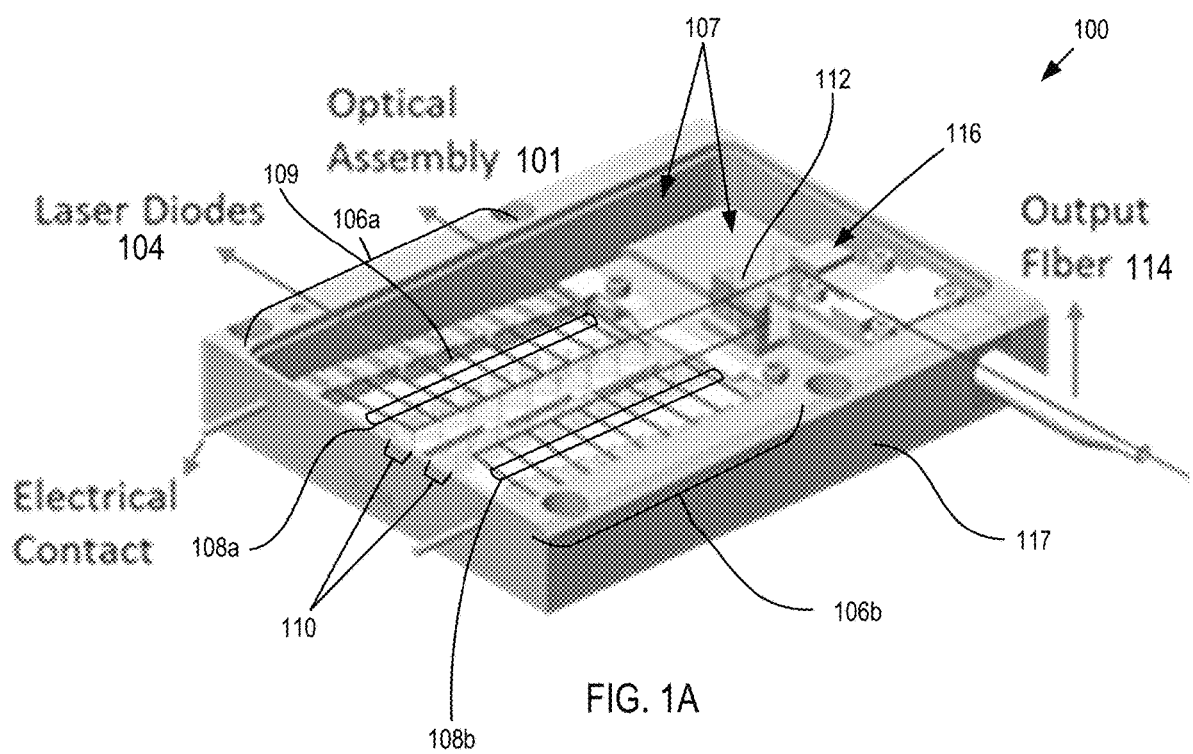
FIG. 1A a perspective view of an example of a conductively-cooled industrial diode laser package, with laser diodes on stair-steps along with FAC, SAC, P-MUX and telescope and their optical paths in the package (indicated by red lines).

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest," "best," "minimum," or the like. It will be appreciated that such descriptions are intended to indicate that a selection among many used functional alternatives can be made, and such selections need not be better, smaller, or otherwise preferable to other selections. It will also be appreciated that various features shown in different embodiments can be combined with various embodiments herein.

As used herein, laser beams comprise optical radiation at wavelengths of between about 100 nm and 10 µm, and typically between about 500 nm and 2 µm. Examples based on available laser diode sources and optical fibers generally are associated with wavelengths of between about 800 nm and 1700 nm. In some examples, propagating optical radiation is referred to as one or more beams having diameters, asymmetric fast and slow axes, beam cross-sectional areas, and beam divergences that can depend on beam wavelength and the optical systems used for beam shaping. For convenience, optical radiation is referred to as light in some examples, and need not be at visible wavelengths.

Typical laser diodes have emission regions having non-circular cross-sections. An emission region of a laser diode can be associated with a slow axis that is directed along a longest dimension of the emission region and a fast axis that is directed along a shortest dimension of the emission region. Along the slow axis, an emitted beam tends to have a smaller angular divergence than the angular divergence along the fast axis. In addition, the slow axis tends to be associated with beam propagation in more transverse modes than beam propagation in the fast axis so that a beam parameter product (corresponding to a product of an angular divergence and a beam dimension) measured along the slow axis is larger than that measured along the fast axis. Beam divergences and diameters along the slow axis, the fast axis, or both can be adjusted with one or more lenses, prisms, or mirrors to provide selected beam characteristics.

As used herein, numerical aperture (NA) refers to a largest angle of incidence with respect to a propagation axis defined by an optical waveguide for which propagating optical radiation is substantially confined. In optical fibers, fiber cores and fiber claddings can have associated NAs, typically defined by refractive index differences between a core and cladding layer, or adjacent cladding layers, respectively. Optical beams as discussed above can also be referred to as having a beam NA which is associated with a beam angular radius. While multi-core step index fibers are described below, gradient index designs can also be used. In the examples disclosed herein, a waveguide core such as an optical fiber core is doped with a rare earth element such as Nd, Yb, Ho, Er, or other active dopants or combinations thereof. Such actively doped cores can provide optical gain in response to optical or other pumping, such as received by laser diode packages. As disclosed below, waveguides having such active dopants can be used to form optical amplifiers, or, if provided with suitable optical feedback such as reflective layers, mirrors, Bragg gratings, or other feedback mechanisms, such waveguides can generate laser emissions. Optical pump radiation can be arranged to co-propagate and/or counter-propagate in the waveguide with respect to a propagation direction of an emitted laser beam or an amplified beam.

The term brightness is used herein to refer to optical beam power per unit area per solid angle. In some examples, optical beam power is provided with one or more laser diodes that produce beams whose solid angles are proportional to beam wavelength and inversely proportional to beam area. Selection of beam area and beam solid angle can produce pump beams that couple selected pump beam powers into one or more core or cladding layers of double, triple, or other single or multi-clad optical fibers. Beam cross-sectional areas, diameters, or other beam dimensions can be described using boundaries that generally correspond to a zero intensity value, a 1/e value, a $1/e^2$ value, a full-width half-maximum (FWHM) value, or other suitable metric.

Optical beams and optical elements are described in some examples with respect to one or more axes. Typically, an axis includes one or more straight line segments along which an optical beam propagates or along which one or more optical elements are situated. Such axes can be bent or folded with reflective surfaces, so that axes need not be single straight line segments. Various lenses are described or may be used, including convex-convex, planoconvex, concave-concave, planoconcave, cylindrical, fresnel, zone plates, holographic, spherical, aspheric, combinations thereof. In convenient examples, cylindrical lenses have cylindrical surfaces that are arranged perpendicular to each other to provide a cross-cylinder or crossed-cylinder lens or lens assembly. In typical examples, planoconvex cylindrical lenses have a plano surface and a cylindrically convex surface that define focal axes that can be parallel to or collinear with an axial center of curvature associated with the cylindrically convex surface. Beams are typically incident to such lenses parallel to an optical axis that is perpendicular to the plano surface. Such beams tend to focus along an axis (e.g., slow axis, fast axis) perpendicular to the focal axes and optical axis, and collimated beams tend to brought to a focus with respect to that axis at the focal axis. It will be appreciated that focal axes can be other than straight, depending on the characteristics of the lens. In some cross-cylinder examples, a first and second objective are spaced apart along an optical axis and provide a set of corresponding focal axes which are perpendicular to each other and intersect each other at a focal plane.

In various embodiments, optical components, such as lenses, mounts, housings, etc., are registered to other optical components. Surfaces of two or more optical components can be registered so as to align the corresponding optical components or to align other optical components or beams. Such registration and alignment can occur axially or transversely or in other ways suitable to provide corresponding alignment of optical components and beams. The term "surface" is used in connection with registering optical components, and it will be appreciated surfaces can include other features, including edges, planes, threads, serrations, textures, chamfers, notches, detents, clamping members, etc., and such surfaces can be arranged in orientations other than parallel or perpendicular to different features of optical components.

Laser diode package examples typically provide a housing to conduct heat out of the package (e.g., through a housing base), provide a protective enclosure from the external environment for the optics, lasers, and other components, and provide a mechanically stable platform for optical and substructure attachment that will maintain internal optical alignments throughout use, provide electrical feedthroughs of sufficient current handling and optical feedthroughs of sufficient size, and provide fastening locations for attaching (e.g., with screws or clamps) the housing to a rigid support that will thermally conduct heat away from the base of the laser package housing.

Figure 1B:
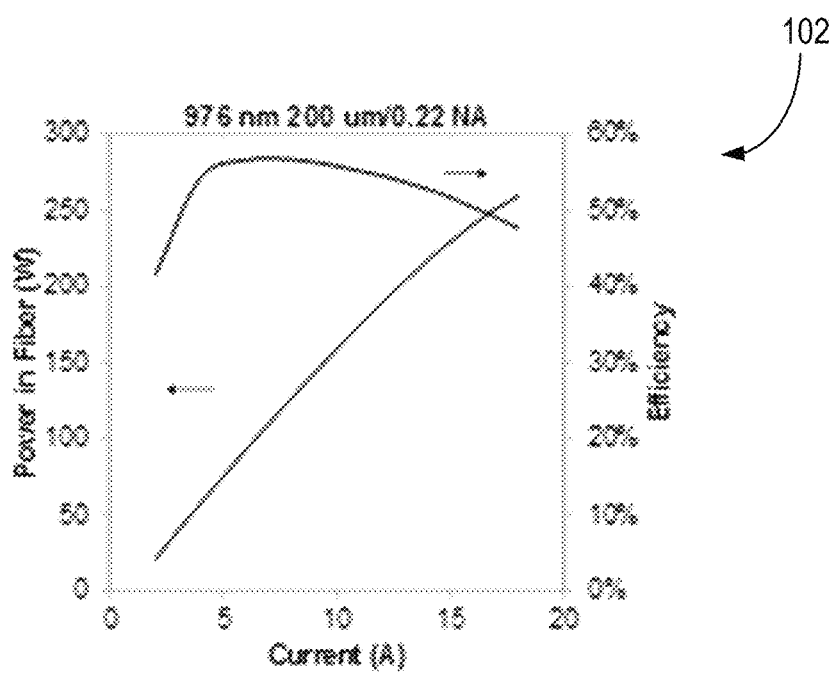
FIG. 1B is a plot showing output power and efficiency of a 976 nm laser diode package coupled into 200 µm 0.22 NA fiber.

FIGS. 1A-1B show an example laser diode package 100 and corresponding performance in graph 102. The laser diode package 100 (with lid omitted) is a conductively-cooled industrial diode laser package that includes an optical assembly 101 having eighteen single-emitter diode lasers 104 arranged in two groups 106a, 106b on a conductive base 107 with stair-step blocks 109. Corresponding laser beam groups 108a, 108b are emitted from the two groups 106a, 106b and stacked in a fast axis (typically associated with a narrower dimension of the emission spot of the laser diodes, corresponding to the semiconductor growth direction) with turning mirrors 110 and combined in the slow axis (typically associated with a wider dimension of the emission spot of the laser diodes, corresponding to the planar direction of the semiconductor layers) through polarization multiplexing with a polarization multiplexer 112.

Each emitted laser beam is individually collimated in the fast axis and slow axis with respective fast axis collimators and slow axis collimators, and is then coupled into an output optical fiber 114 using a single focusing objective 116. The laser diode package 100 generally provides superior pointing accuracy for the coupling of the laser beam groups 108a, 108b into the optical fiber 114, with high brightness and low optical loss. As shown in the graph 102 of FIG. 1B, typical performance of the laser diode package 100 includes producing and coupling about 250 W of optical output at an operating current of 17 A into a 200 μm and 0.22 NA core of the optical fiber 114 with close to 50% electric-to-optical efficiency. The laser diode package 100, including a housing 117, has a mass of about 495 g and a volume of 103 cm$^3$, providing a 2.0 g/W mass-to-power ratio and a 2.4 W/cm$^3$ power-to-volume ratio. Although such metrics are generally superior by industrial standards and can be used as a "work horse" in industrial fiber lasers, significant reduction in mass and volume is needed to meet the requirements for high energy laser applications, such as HEL.

Figure 2A:
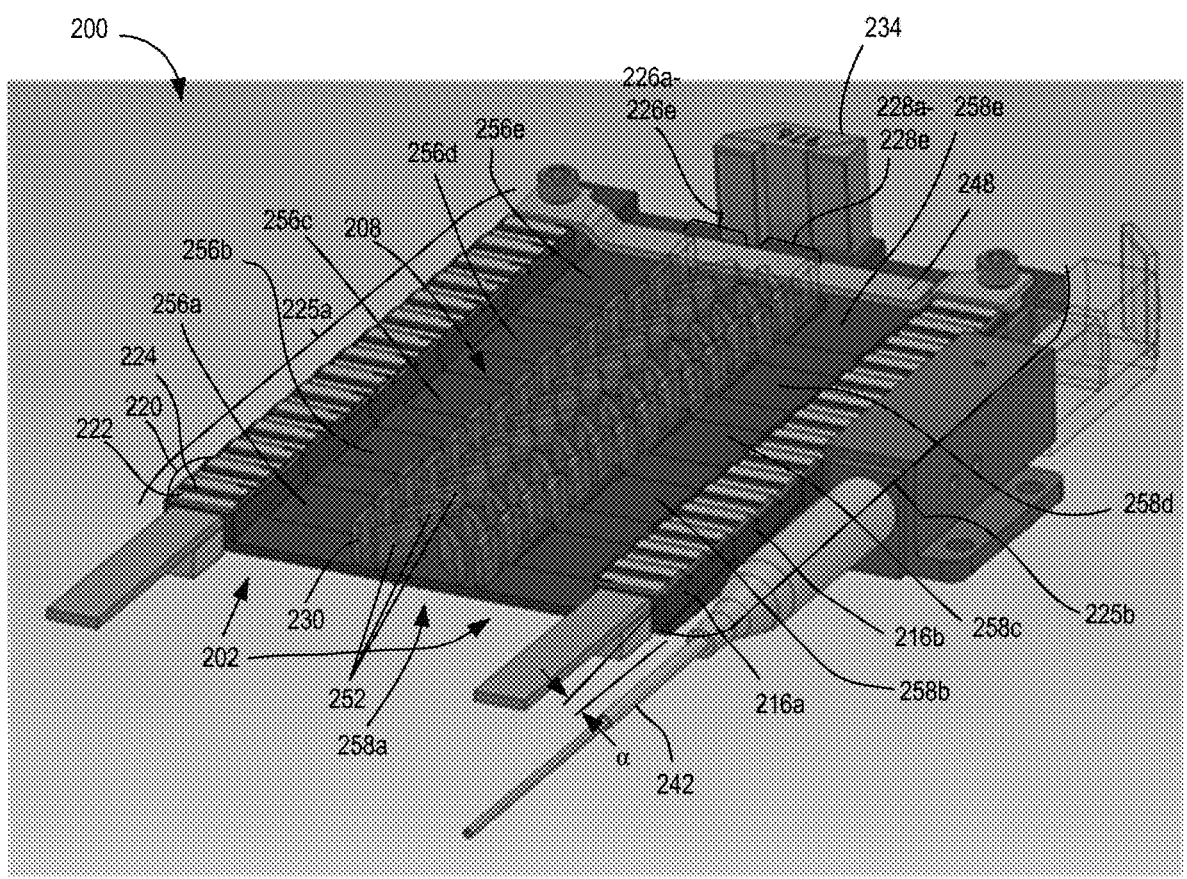
FIG. 2A shows a perspective view of a proposed low SWAP and high power diode laser pump with compact low volume design which will reside on top of OHP cooling chamber.
Figure 2B:
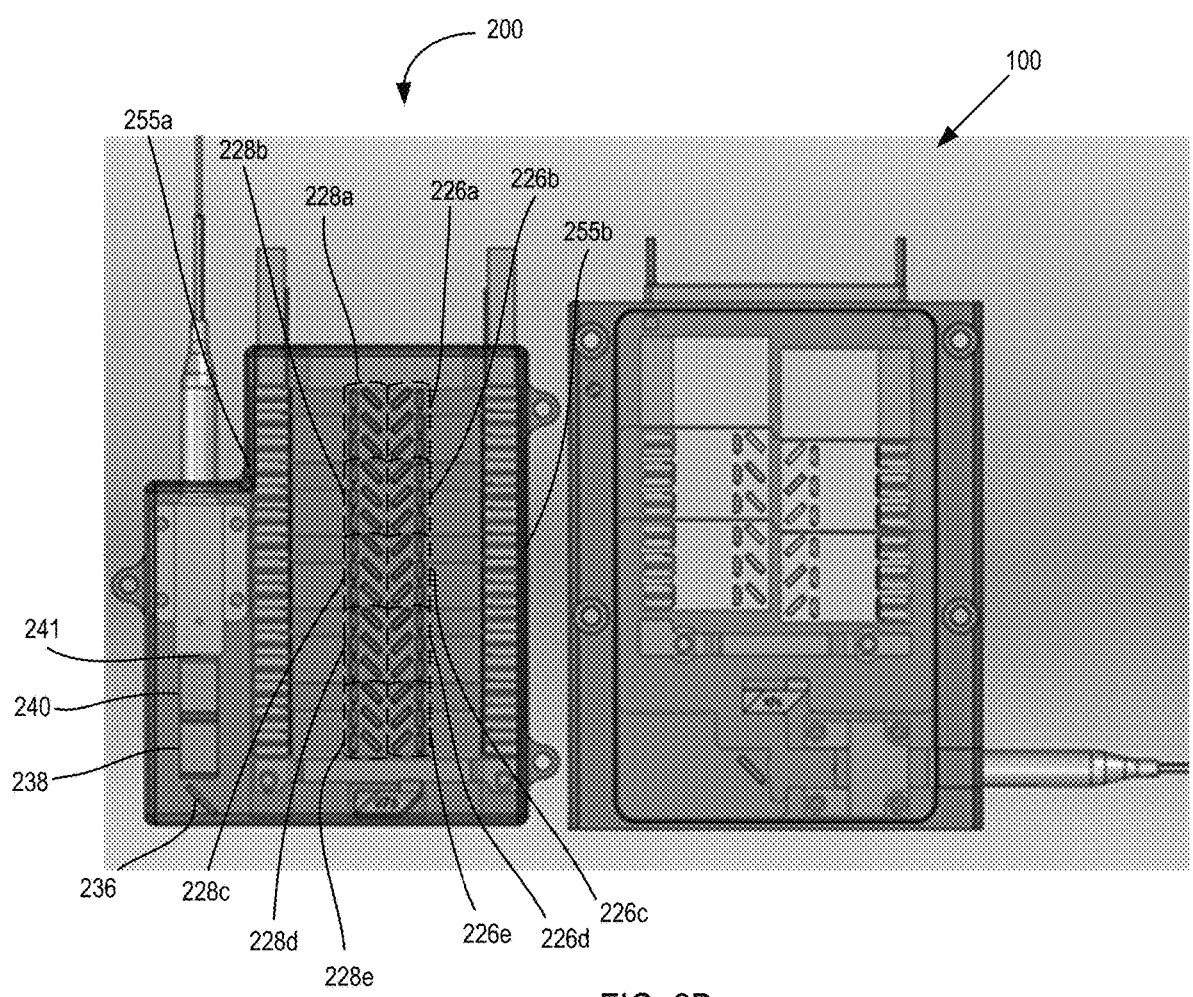
FIG. 2B shows schematics of footprints of proposed low SWAP diode laser package sitting adjacent another diode laser package, showing 15% reduction in footprint at almost 3× higher output power.
Figure 2C:
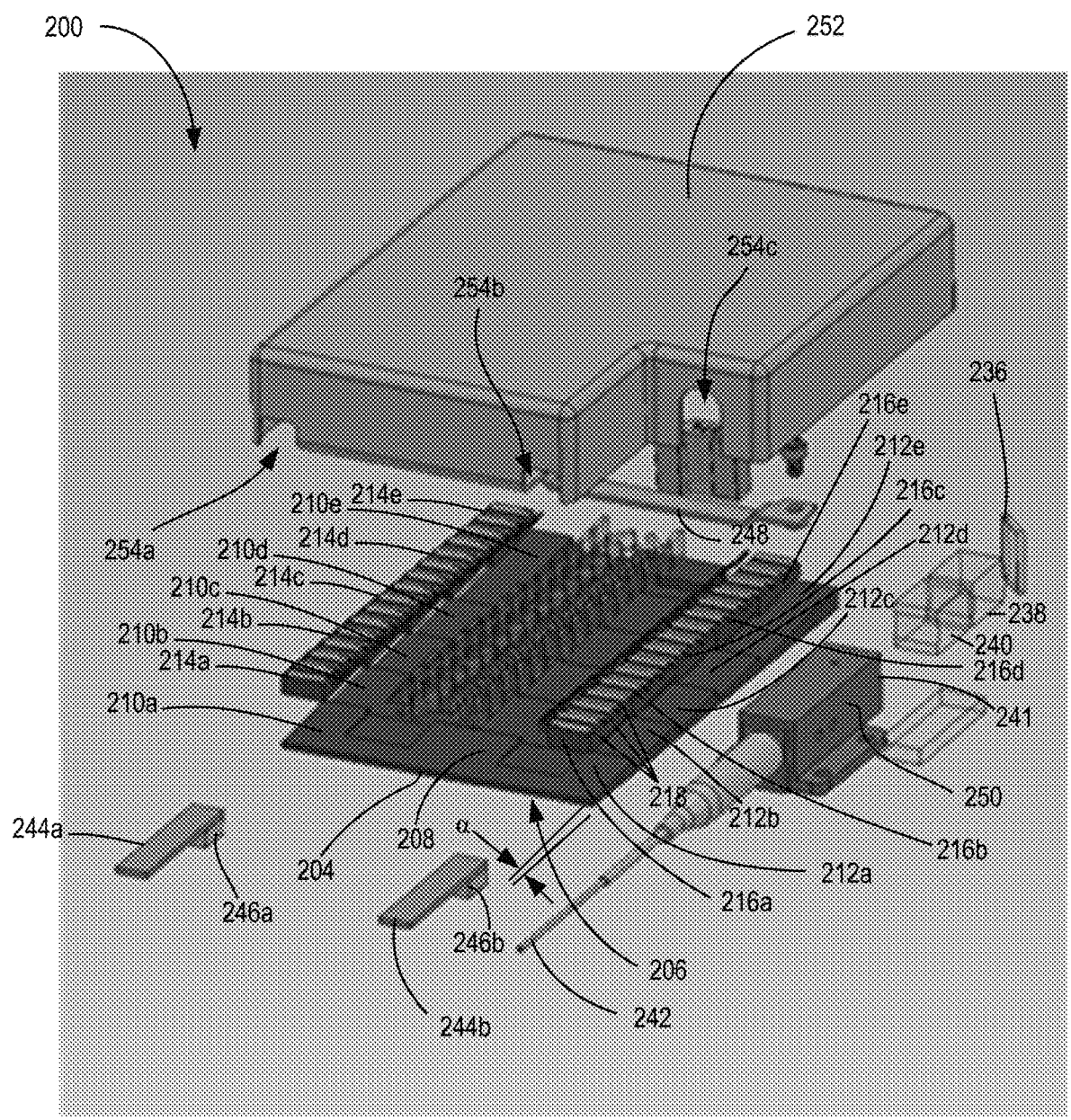
FIG. 2C shows an exploded view of a proposed high power low SWAP pump "optical bench".

FIGS. 2A-2C depict an example of a laser diode package 200 that is configured to have a low size, weight, and power consumption (SWAP) and a high optical power output and a high electrical-to-optical efficiency with a diode laser pump "optical bench" design. The laser diode package 200 includes a conductive base 202 that includes a generally planar member 204 that includes a base surface 206 and an opposing optical assembly mounting surface 208 that includes a plurality of stepped mounting block surfaces 210a-210e, 212a-212e. The conductive base 202 is typically made of copper, though in some examples discussed further hereinbelow the conductive base 202 can be aluminum with copper inserts. The conductive base 202 further includes a plurality of mounting blocks 214a-214e, 216a-216e that are secured to the mounting block surfaces 210a-210e, 212a-212e. Each of the mounting blocks 212a-212e, 214a-214e includes a plurality of stepped surfaces 218 that are parallel to the mounting block surfaces 210a-210e, 212a-212e in typical examples. The mounting blocks 212a-212e, 214a-214e are also typically made of copper, rather than copper-tungsten, further reducing weight. The stepped surfaces 218 are situated to receive chip-on-submounts (CoS) 220, each including a conductive planar member 222 (typically copper) on which a laser diode 224 is mounted, and forming laser diode groups 225a, 225b. The laser diodes 224 of the laser diode groups 225a, 225b emit laser beams in respective common directions (typically opposite each other). Fast axis collimators are typically situated closely adjacent to the laser diodes 224 to collimate fast axes of the emitted beams.

A plurality of groups of optics 226a-226e, 228a-228e are mounted on the respective mounting block surfaces 210a-210e, 212a-212e, each group including a plurality of slow axis collimators 230 situated respective laser beams from the laser diodes 224, and a plurality of turning mirrors 232 of varying heights that turn the respective laser beams so that the propagating beams propagate in common stack directions (e.g., perpendicular to the incident directions) with fast axes and propagation axes of the beams from each laser diode group 225a, 225b being situated in respective parallel planes. The stacked beams are received by a polarization multiplexer 234 that combine the two stacks by rotating the polarization of the light one of the groups of beams (e.g., with a waveplate) and superimposing each group with a polarization sensitive beam splitter. The combined beam is reflected with a beam reflector 236 that directs the combined beam to fast axis telescopes 238, 240 and then a focusing objective 241 that focuses and coupled the combined beam into an output optical fiber 242.

Electrical power is coupled into the laser diode groups 225a, 225b with electrodes 244a, 244b coupled to standoffs 246a, 246b mounted to the conductive base 202 or a surface of a 2-phase cooling unit (not shown) that is directly coupled to the base surface 206, series connections between adjacent laser diodes, and a bus bar 248 that bridges the laser diode groups 225a, 225b to form a circuit. The output optical fiber 242 is terminated in a fiber termination housing 250 that can be a conductive portion of the laser diode package 200 that is separate or separable from the conductive base 202. A lid 252 can be configured to enclose the conductive base member 202, or the conductive base member 202 and the fiber termination housing 250, and typically includes holes and/or cutouts 254a-254c to receive the electrodes 244a, 244b and fiber termination housing 250, such as described in commonly owned U.S. patent application Ser. No. 15/849, 057 ("Low cost optical pump laser package"), which is incorporated by reference herein. In some examples, the lid 252 can be secured to the conductive base 202, and in additional examples the lid 252 is secured instead or in addition to another portion of the laser diode package, such as a 2-phase cooling unit. In representative examples, the lid 252 is aluminum and comprises additional sides of the laser diode package 200, further reducing the weight of the laser diode package 200.

As can be seen with a side-by-side comparison with the laser diode package 100 in FIG. 2B, the laser diodes 224 of each group 225a, 225b are more closely arranged than groups 106a, 106b, and the total area of the conductive base 202 is substantially smaller than the conductive base 107. In representative examples, the conductive planar members 222 of the chip-on-submounts (CoS) 220 and the rear facets of the laser diodes 224 are immediately adjacent to opposing edges/sides 255a, 255b of the conductive base member 202. Also, as can be seen in FIGS. 2A and 2C, an angle α is defined between the mounting block surfaces 210a-210e, 212a-212e (or stepped surfaces 218) and the base surface 206 such that a common distance is provided between each of the laser diodes 224 of the laser diode groups 225a, 225b and the base surface 206. The common distance provides a sufficiently short thermal path that corresponds to a reduction in thermal resistance between the laser diodes 224 and the base surface 206, allowing the diodes to be driven at a higher output power and to be spaced more closely together. The reduction in material corresponding to adoption of the common distance, and the reduction of the material corresponding with reducing the common distance to a distance that corresponds to a sufficiently small thermal resistance, also reduces the weight and volume of the laser diode package 200 as compared to the laser diode package 100.

In some examples, the mounting block surfaces 210a-210e, 212a-212e can be interrupted to form sloped surfaces 256a-256e, 258a-258e that further reduce mass. In further examples, the sloped surfaces 256a-256e, 258a-258e can form two respective common planar surfaces. In a specific example, an improvement in thermal conductance can be twice that of other similar laser diode packages while reducing the total mass, thereby providing the laser diode package 200 at less than 140 grams for all of the parts shown in FIG. 2A. In the specific example, with fifteen emitters in each of the laser diode groups 225a, 225b, more than 660 W of optical output power at 55% electrical-to-optical efficiency and 200 μm 0.18 NA beam at 976 nm can be achieved, which is a power that is almost three times greater than the power of a similar laser diode package and with improved efficiency. To achieve such performance, the mass contribution in the specific example can include the conductive member 204 having a mass of 58.2 g, the plurality of mounting blocks 214a-214e, 216a-216e having a mass of 20.2 g, the chip-on-submounts 220, optical components 226a-241 having a mass of 6.4 g, the bus bar 248 having a mass of 1.6 g, the lid 252 having a mass of 21.6 g, and the fiber termination housing 250 and output end of the output optical fiber 242 having a mass of 26 g.

Figure 3:
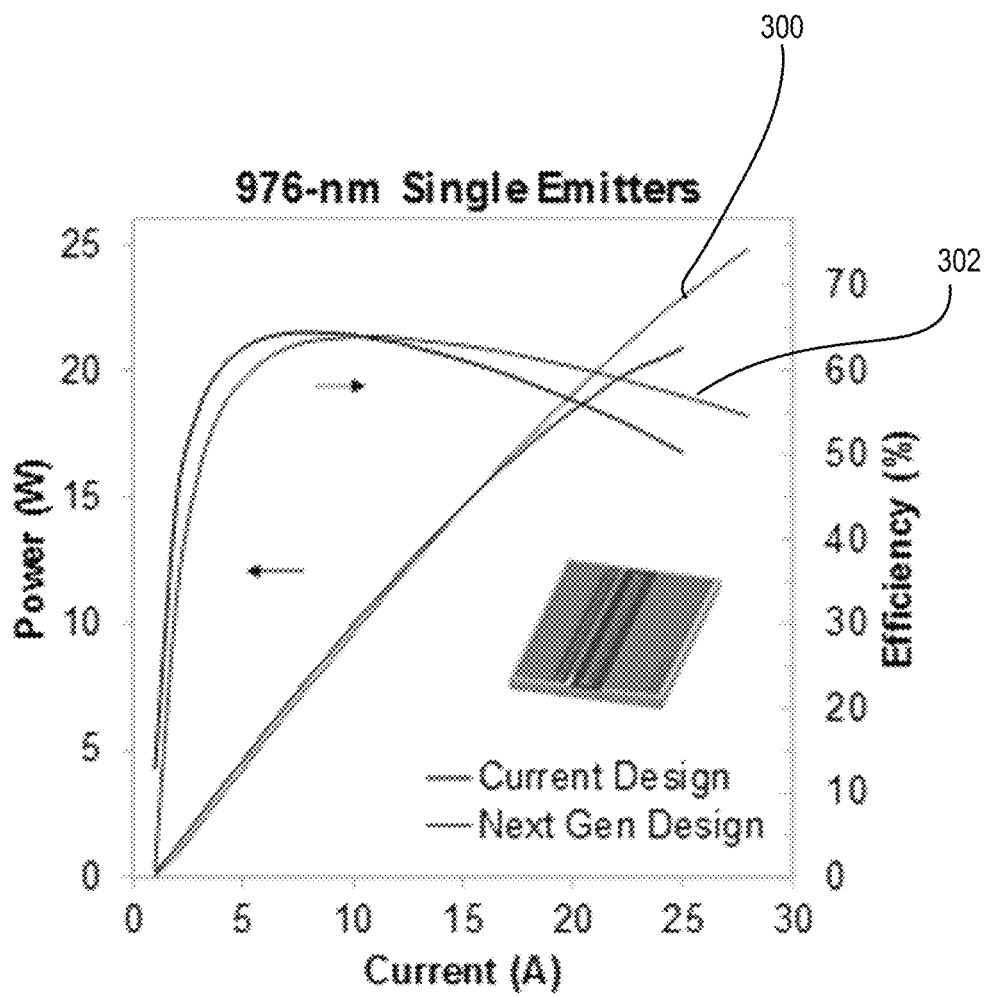
FIG. 3 is a graph of power and efficiency of 976-nm single emitter diode laser performance associated with the laser diode package shown in FIGS. 2A-2C.

In representative examples, the brightness and efficiency of single emitter diode lasers are improved such that the laser diodes 224 can be driven at higher currents while maintaining or providing superior brightness (i.e., W/bpp$^2$). In some examples, the laser diodes 224 can include 976-nm single emitter diode lasers made by nLIGHT, Inc., which can include performance characteristics shown in FIG. 3. Representative diode lasers can respectively emit greater than 25 W out of emission facets at high electrical-to-optical power conversion efficiency, as shown with power performance line 300 and efficiency performance line 302, with sufficient beam parameter product (BPP) to be coupled into the output optical fiber 242 having a 200 μm pump core diameter and 0.22 NA. The power and efficiency of the laser diodes can be further improved by providing laser diodes 224 in the example configuration of laser diode package 200, including by reducing the thermal resistance between the diode junction of the laser diodes 224 and the heatsinking two-phase cooling unit directly coupled to the base surface 206, and therefore enabling greater than 660 W and 55% efficient fiber-coupled optical power.

The example laser diode package 100 shown in FIG. 1A has a thermal resistance of about 3.3° C./W. A substantial portion of this thermal resistance is associated with the thick metal stacks (CuW stair-steps 109 and supercarrier 107) that the laser diodes 104 are mounted on and the large resistance from the thermal interface to the coldplate coupled to the bottom of the conductive base 107. To achieve the desired improvements in output power, weight, and volume, the total thermal resistance should be reduced to 1.5° C./W or lower. To achieve this, examples of the laser diode package 200 have a planar copper "optical bench" design that avoids using CuW stair-steps and supercarrier but instead uses copper stair-step mounting blocks 214a-214e, 216a-216e that are directly attached to the planar base member 204 that includes copper or that is made of copper. With these changes, the mass of the laser diode package 200 is reduced and the distance from the junction of each laser diode 224 to the heatsink through the base surface 206 is equalized. Also contributing to the reduction in thermal resistance is the direct brazing of the base surface 206 of the conductive base 202 onto the two-phase cooling cold plate for minimum interfacial thermal penalty. In representative examples, the base surface 206 forms a partial lid or seal of an opening of a cooling chamber of the two-phase cooling cold plate.

Figure 4A:
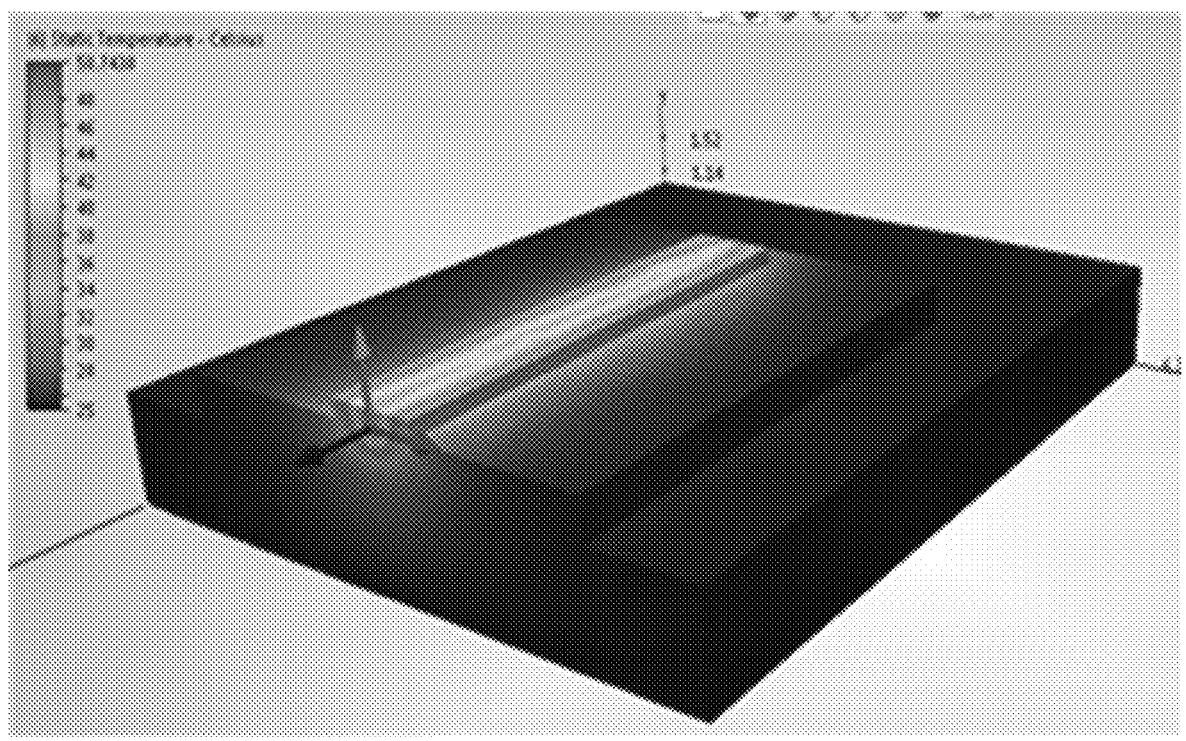
FIG. 4A shows a perspective view of a finite element thermal analysis model of diode laser CoS on copper base plate with various thickness.
Figure 4B:
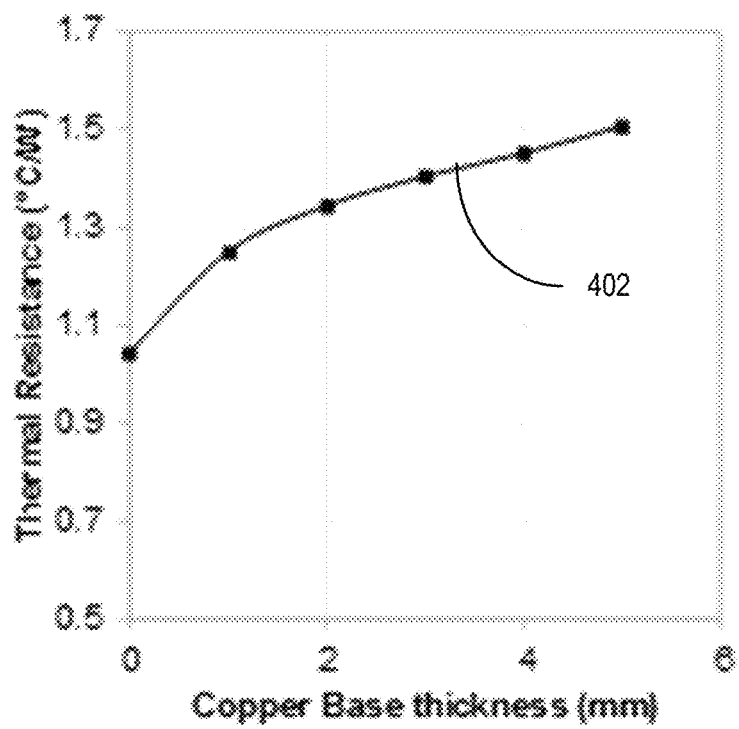
FIG. 4B shows the simulated thermal resistance values as a function of copper base thickness for the model shown in FIG. 4A. In some examples, a 5-mm thick base plate provides a sufficient thermal conductance.
Figure 5:
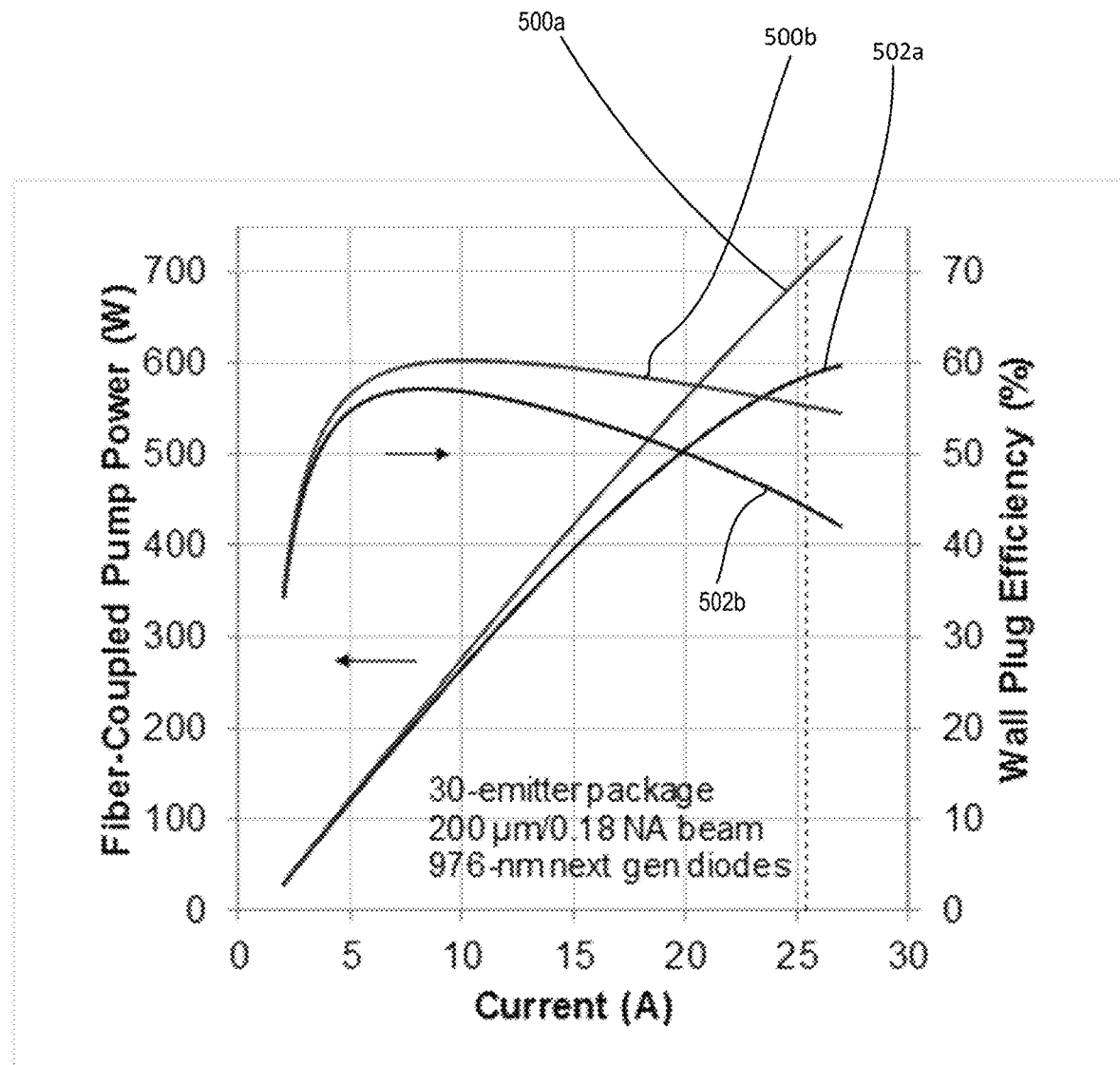
FIG. 5 is a graph of projected power and efficiency of fiber-coupled 200 µm 0.18 NA beam for the proposed thirty-emitter diode laser pump. For comparison, the expected power and efficiency of a thirty-emitter diode package with element-equivalent thermal resistance are also plotted.
Figure 6:
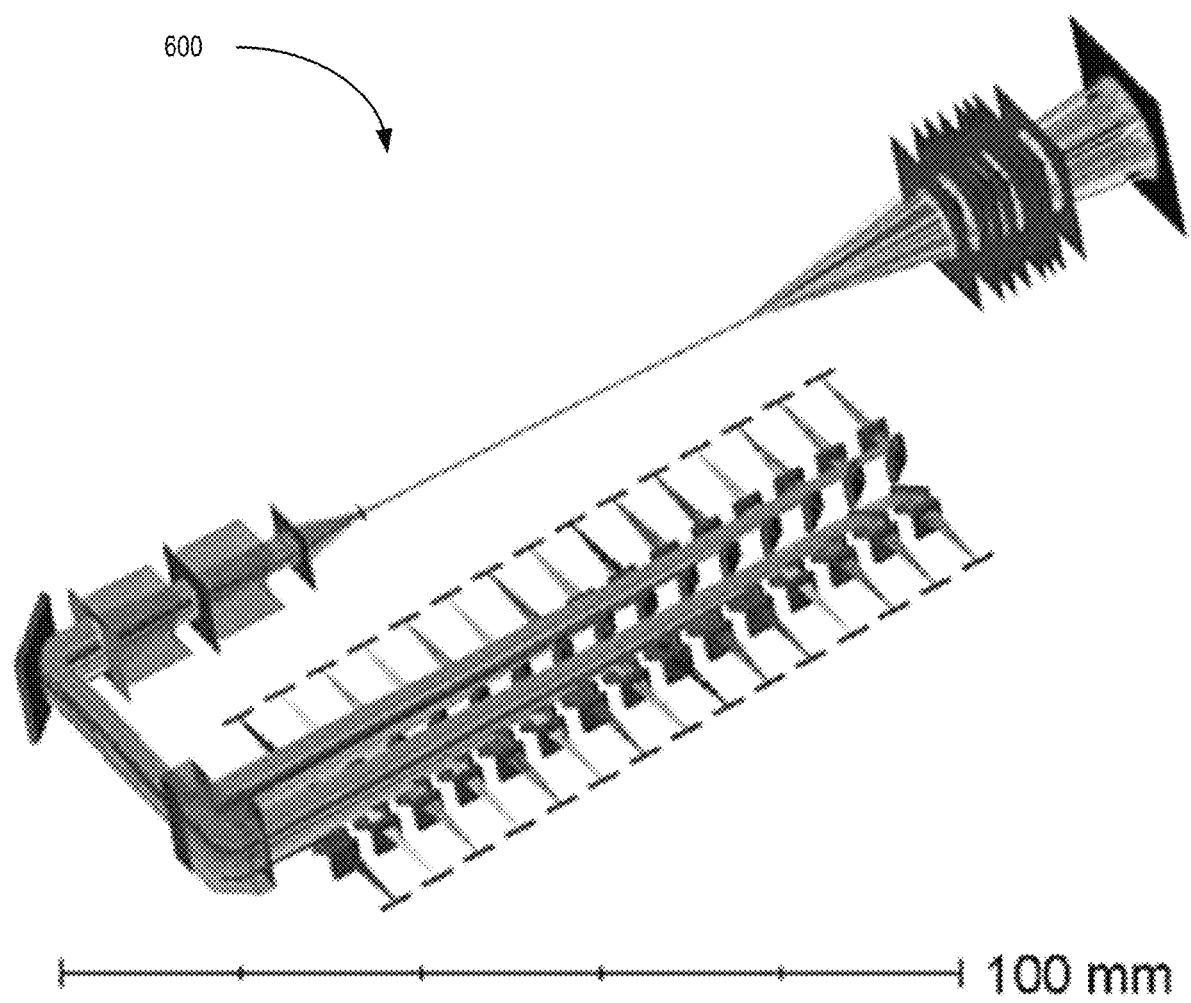
FIG. 6 shows a perspective view of an example optical train of the an example thirty-emitter low SWAP, high power, and high efficiency diode laser package.

A finite element thermal analysis 400, shown in FIGS. 4A-4B, predicts an improvement in thermal resistance with values in the range of 1.1 to 1.5° C./W, depending on the thickness of the conductive base 202 that is made of copper. In the analysis, the thermal resistance contributions from the laser diodes 224 and multiple solder-lines or layers are also included to agree with the experimentally measured thermal resistance values. The forecasted range of thermal resistance, as shown with line 402, is at least a factor of two lower than the current passively-cooled package configurations, such as that of laser diode package 100. Based on the thermal resistance value (1.5° C./W for examples of the laser diode package 200) and 90% ex-facet-to-fiber-coupled optical efficiency (which is an expected efficiency value for state-of-the-art laser diode packages herein), a projected performance 500a, 500b of the laser diode package 200 with thirty of the laser diodes 224 arranged in the laser diode groups 225a, 225b and fiber-coupled into the output optical fiber 242 is shown in FIG. 5. At a drive current of 25 A, examples of the laser diode package 200 is projected to deliver greater than 660 W and 55% efficient fiber-coupled power into the 200 μm 0.18 NA beam. It will be appreciated that in some examples, a reduced power output can be provided as well based on the amount of current directed through the electrodes 244a, 244b. Because the numerical aperture of the output optical fiber 242 is under-filled, there is very little or no stray light in the cladding of the output optical fiber 242, as can be seen in the Zemax modeling result 700 shown in FIG. 7. Graph 702 shows an intensity profile of a combined beam of thirty single-emitters at the input of an output optical fiber and launched into a 200 μm core diameter of the output optical fiber (indicated by the dashed line). Graph 704 of the Zemax model shows a launch NA of the combined beam with 0.22 NA limit associated with the 200 μm core of the output optical fiber (dashed line). Thus, in representative examples, output optical fibers (such as the output optical fiber 242) do not need to be water-cooled or actively cooled, as is required in many other fiber-coupled laser packages that generate and couple substantial optical output powers into output optical fibers. For a comparison, the expected power and efficiency of a thirty-emitter laser diode package with thermal resistance equivalent to other laser diode package examples (e.g., the example laser diode package 100 on the right in FIG. 2B) are also plotted in FIG. 5 with lines 502a, 502b. The improved performance shown with lines 500a, 500b demonstrates the significance of minimizing thermal resistance between the diode junction of the laser diodes 224 and the heatsink coupling to the base surface 206, in enhancing the power and efficiency of the laser diode package 200. In additional examples, thermal resistances achieved can include 1.6° C./W or lower, 1.8° C./W or lower, 2.0° C./W or lower, 2.3° C./W or lower, 2.6° C./W or lower, or 3.0° C./W or lower.

Figure 7:
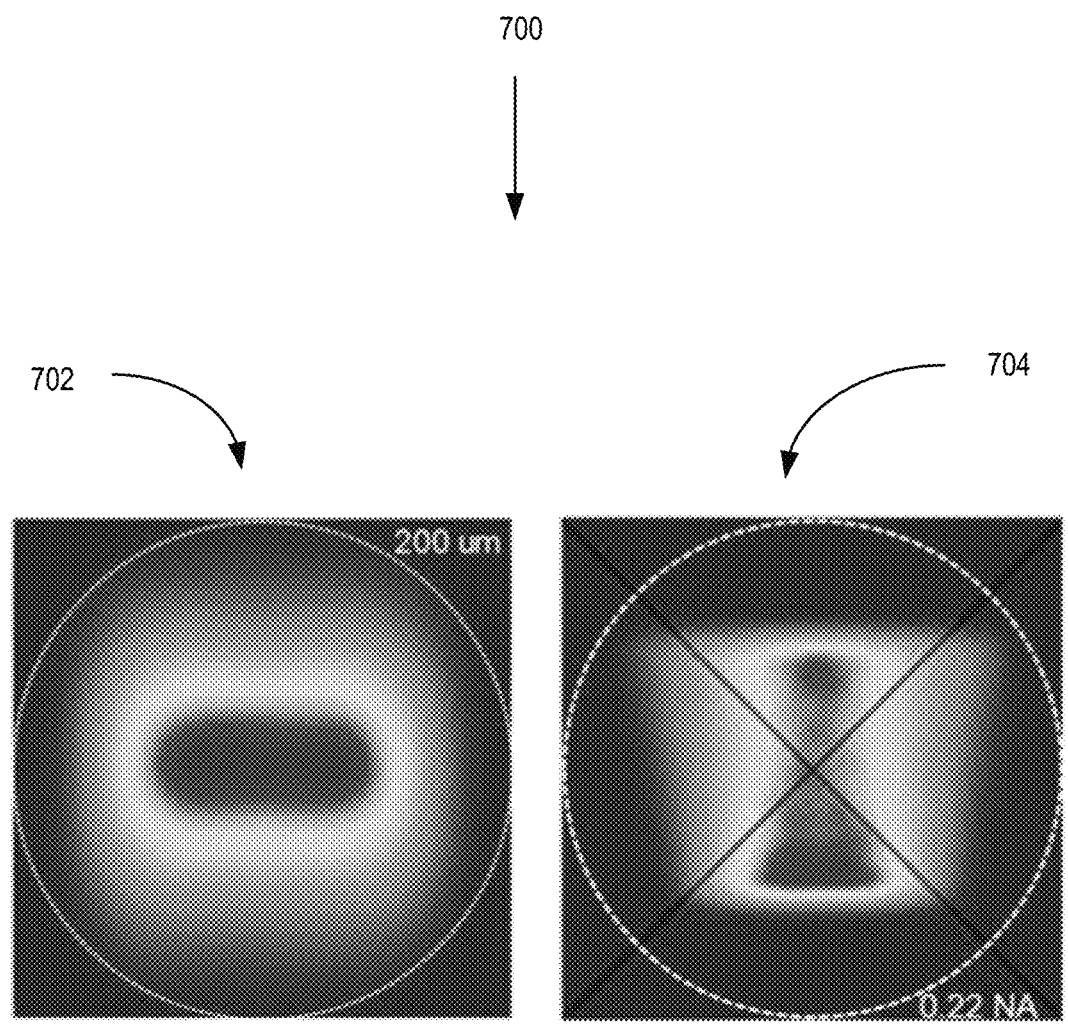
FIG. 7 shows (left) the intensity profile at the fiber input as modeled by Zemax for the thirty-emitters launching into a 200 um fiber (indicated by the dashed line) and shows (right) the Zemax model of the launch NA for the package as limited to 0.22 NA (dashed line).
Figure 8:
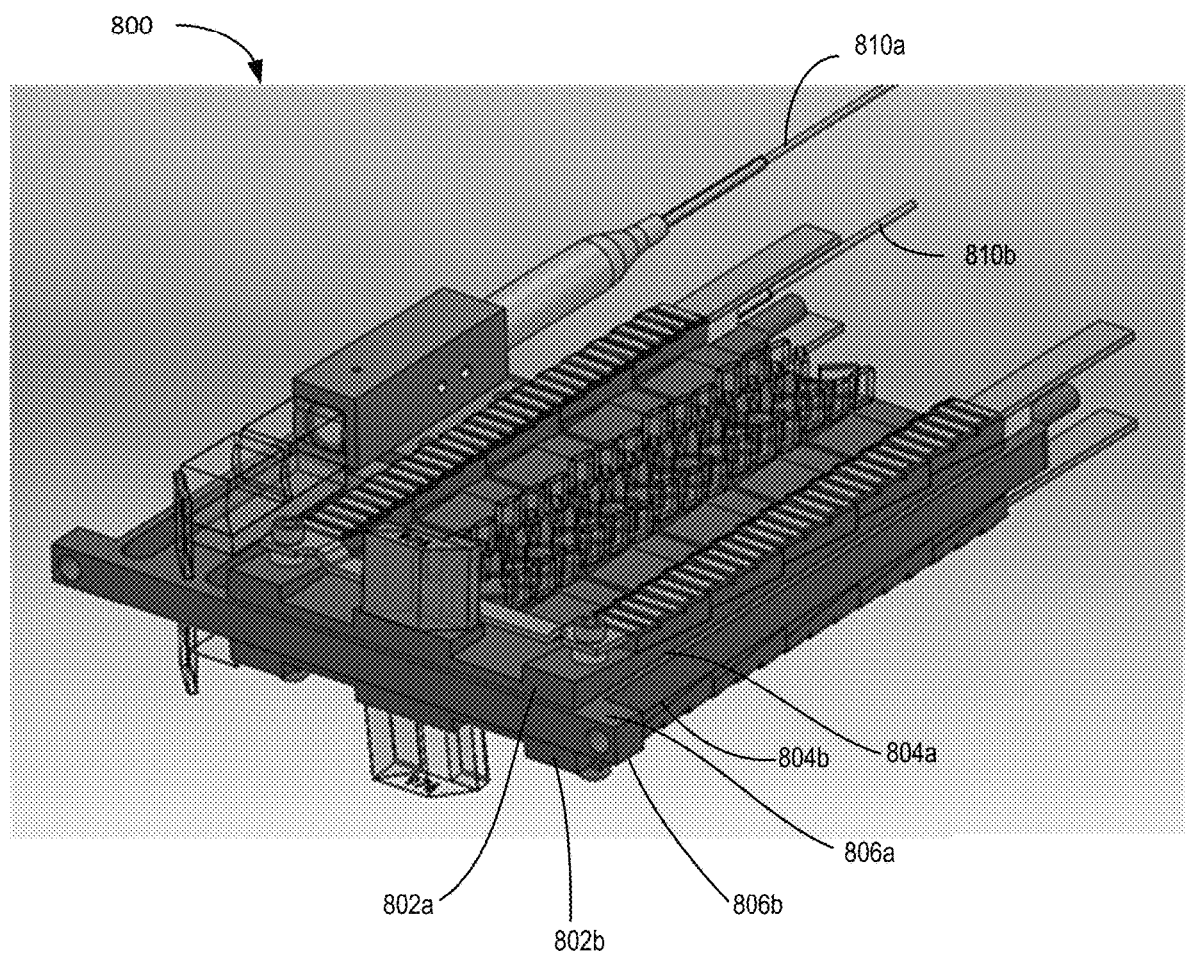
FIG. 8 is a schematic showing an example laser diode package with multiple conductive bases and a common cooling chamber to produce close to 1.4 kW in 220 cm$^3$ volume. This example shows a scheme that is traceable to a "pump blade" with three of these modules integrated together and six output fibers that can pump a fiber amplifier.

The optical train of the example laser diode package 200, modeled using Zemax ray tracing, is illustrated in ray trace 600 in FIG. 8. The optical train includes a balanced beam spot size and beam NA at fiber input that improves fiber coupling efficiency into the output optical fiber 242 and minimizes optical losses in the laser diode package 200. Fast axis telescope components and vertical epitaxy designs can fill fast axis NA in collimated space, and can be used to achieve a nearly 100% fill-factor for the laser diode beams in combined beam stacks, as disclosed in co-pending U.S. patent application Ser. No. 15/867,540 ("Power and Brightness Scaling in Fiber Coupled Diode Lasers Using Diodes with Optimized Beam Dimensions") which is incorporated herein by reference, maximizing brightness in the laser diode package 200. As discussed above, FIG. 7 shows the modeled spot size of a combined beam at the output optical fiber input, as well as the beam divergence in the NA space. In the NA space, all power from the thirty emitters fits into the 0.22 NA of the fiber, as indicated by the dashed line in the figure. A total power of 95% or greater was calculated to be enclosed within 0.18 NA. In the physical space, the focused spot for the thirty emitters is almost completely contained within the fiber core diameter of 200 μm, indicating a close to 100% fiber coupling efficiency. Further power scaling of the laser diode package 200 can be achieved by increasing the single emitter diode count, such as with additional stepped surfaces 218, and can be achieved without substantially altering conversion efficiency and specific volume and mass. The extra room in both the physical space and the NA space of a 200-μm, 0.22 NA (as shown in FIG. 7) allows stacking of additional single emitter diodes.

In some examples, up to at least twelve additional laser diodes 224 can be stacked on additional stepped surfaces 218 (e.g., with additional mounting block), to allow scaling of power of the laser diode package to 1 kW per module while maintaining the same or similar specific weight and volume.

Figure 9:
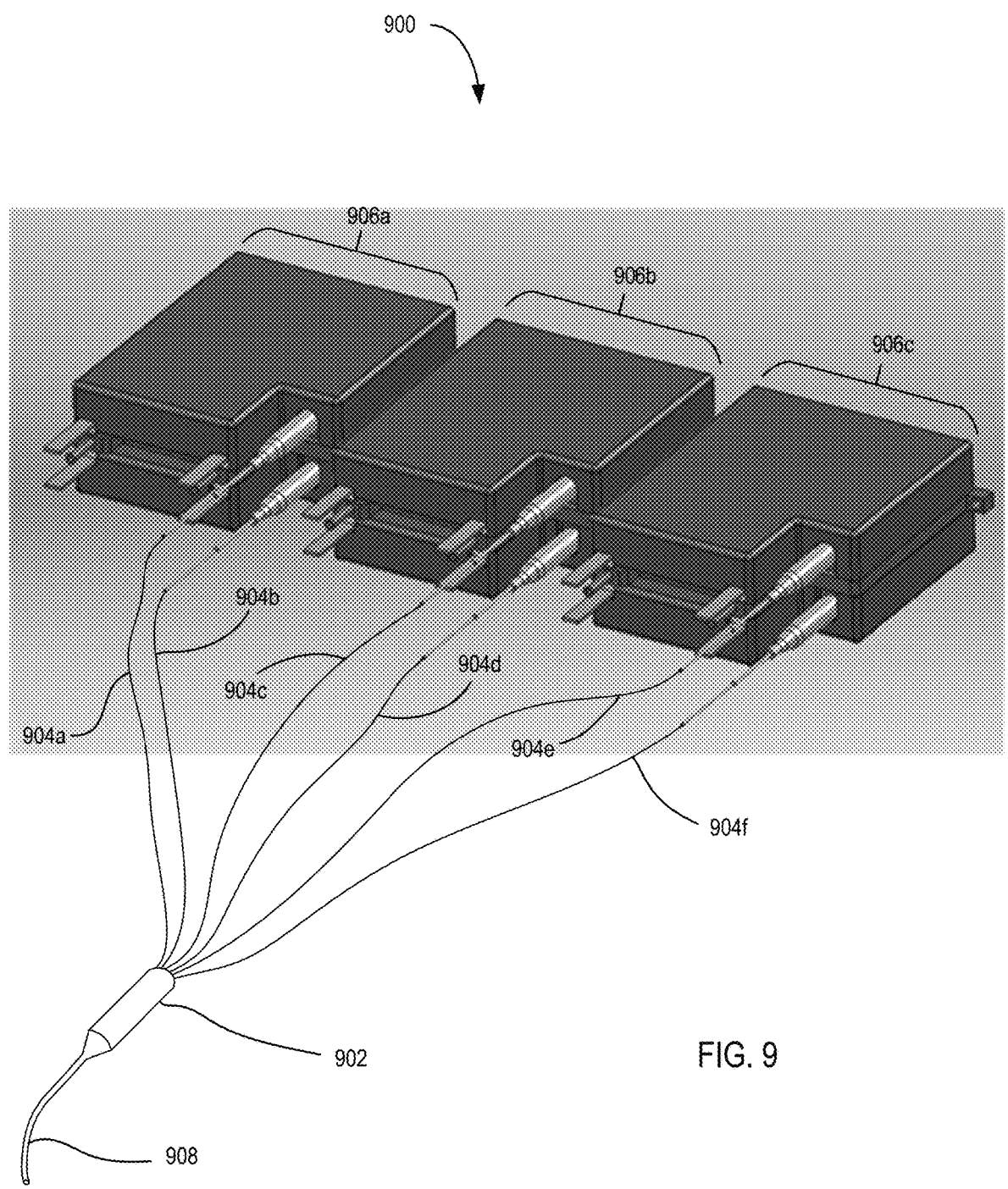
FIG. 9 is a schematic showing a "pump blad2e" with three "double-decker" pump modules integrated together and six output fibers that can be directly coupled to a fiber amplifier with a 6+6:1 combiner.
Figure 10A:
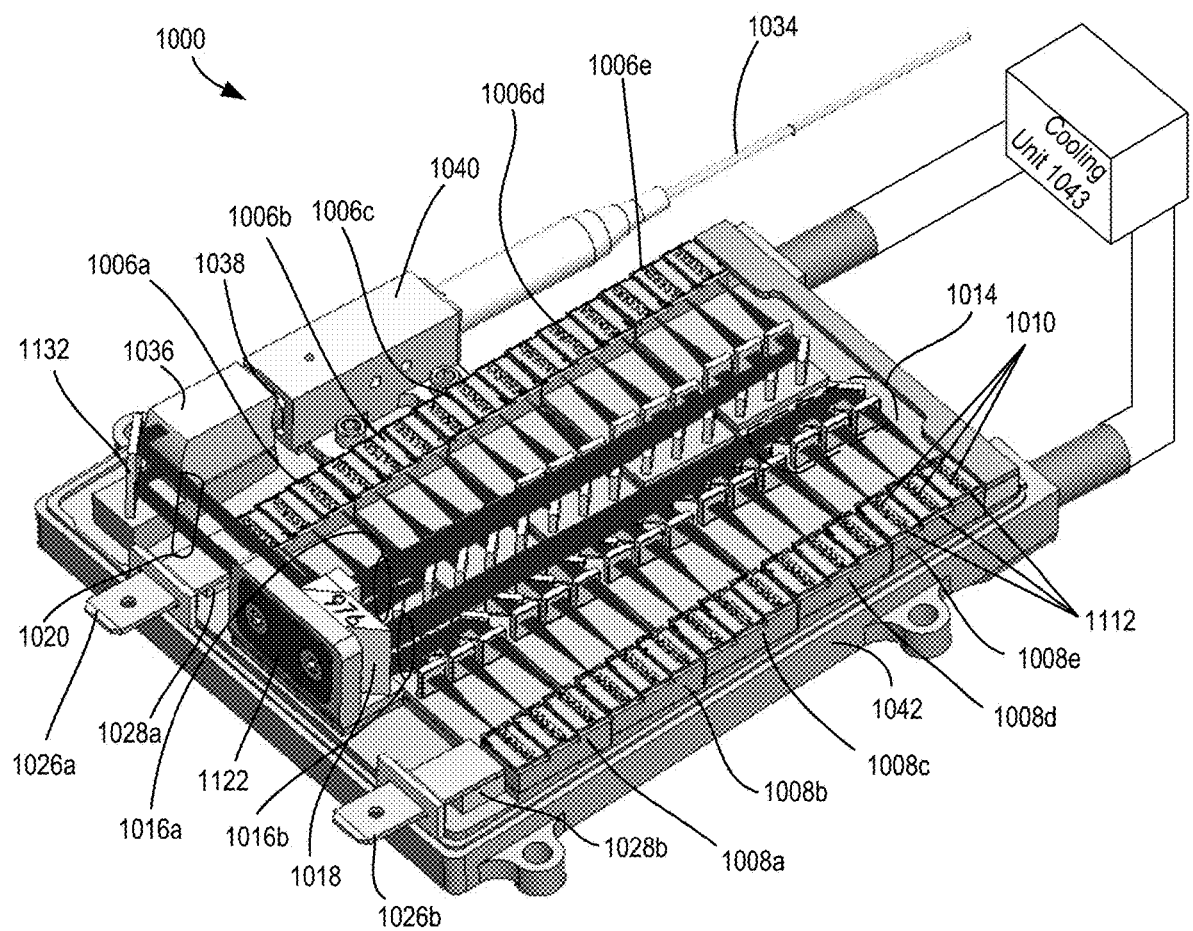
FIGS. 10A-10E are perspective views and an exploded view of an example laser diode package with 2-phase cooling unit.
Figure 10D:
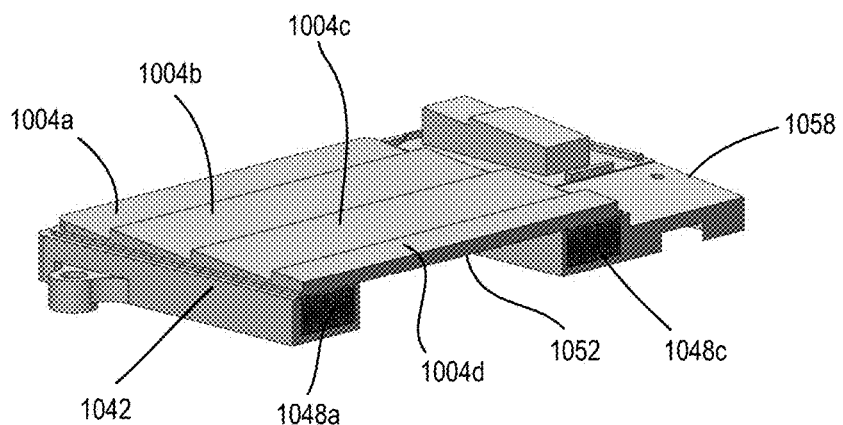
Figure 10B:
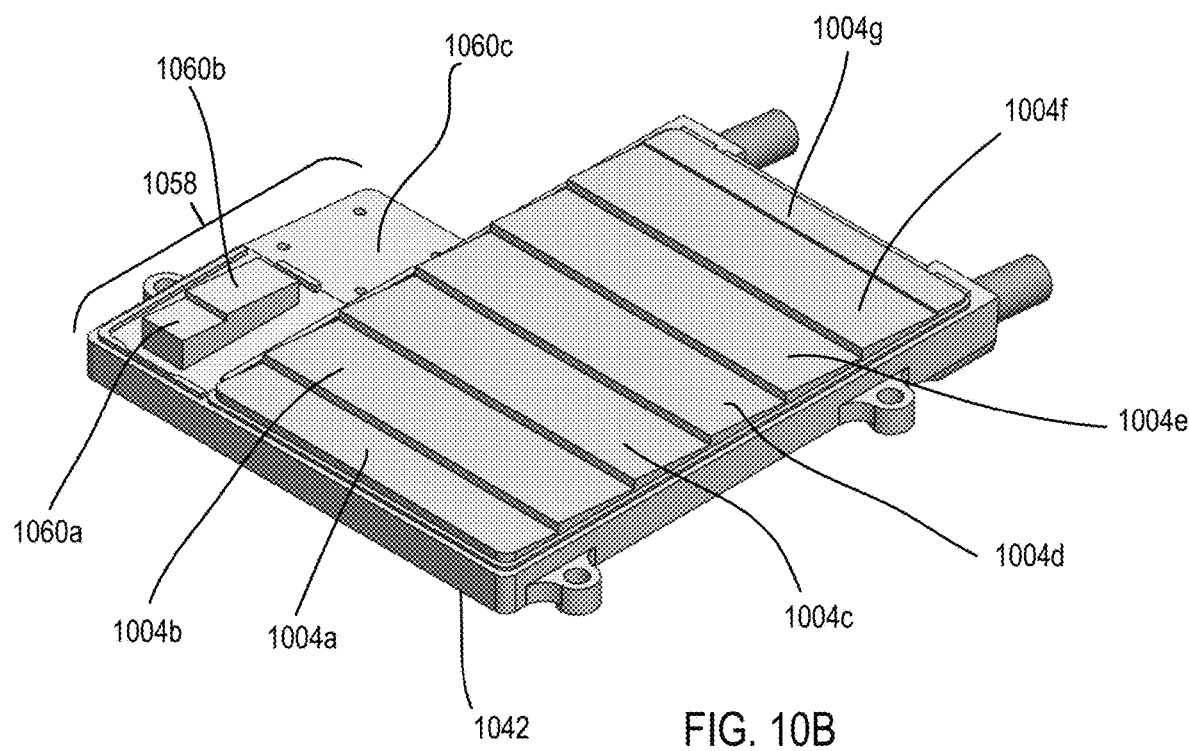
Figure 10C:
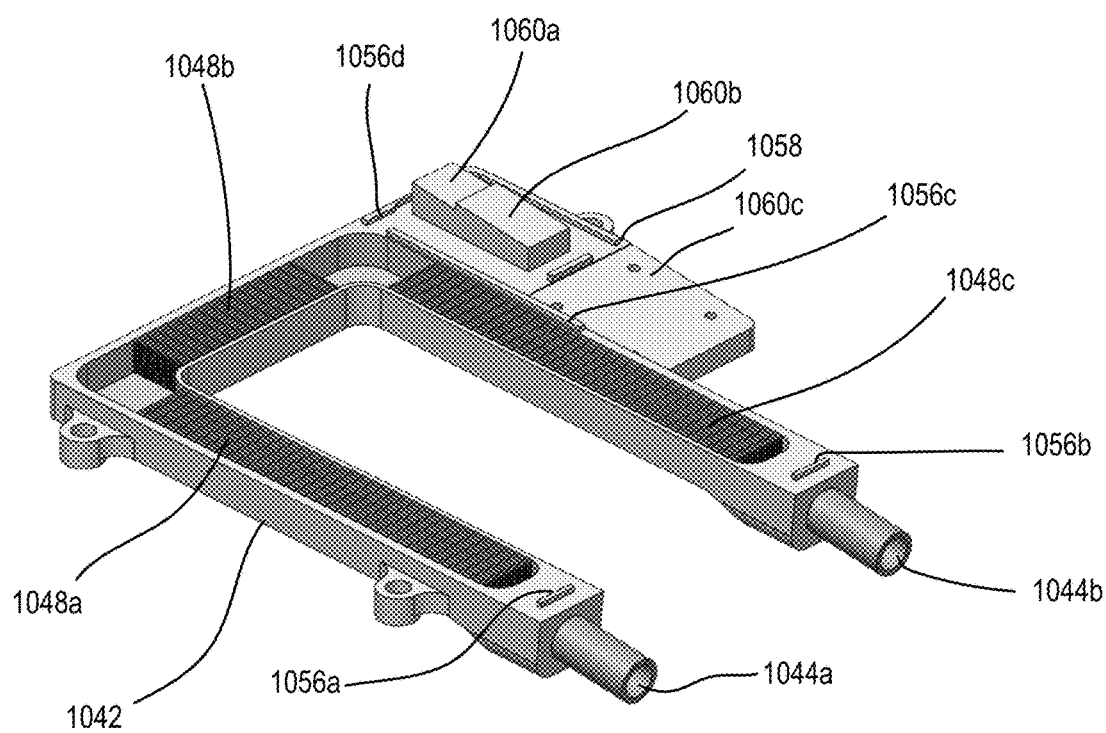
Figure 10E:
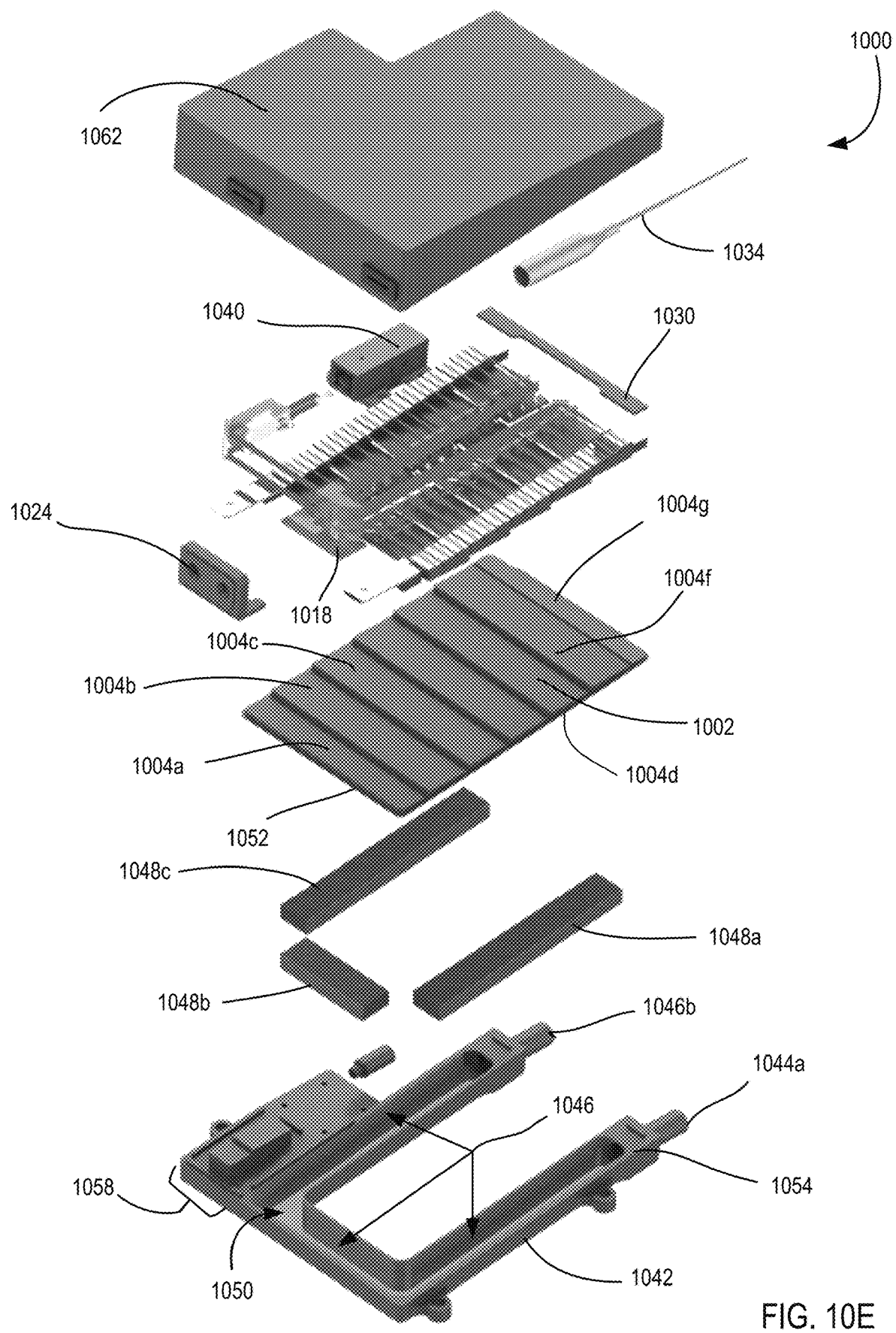

FIG. 8 is an example laser diode package 800 that includes conductive bases 802a, 802b including respective opposing base surfaces 804a, 804b directly coupled to respective surfaces 806a, 806b of a heatsink 808 that includes a heat exchanger of a two-phase cooling unit. The heatsink 808 can simultaneously transfer heat generated by laser diodes coupled to both of the conductive bases 804a, 804b, thereby economizing space. For example, with the opposing base surfaces 804a, 804b coupled to the heatsink 808, laser diodes associated with conductive bases 802a, 802b can be symmetrically situated to improve cooling efficiency. The symmetric configuration can provide the opposite thermal paths of the laser diodes coupled to the respective conductive bases 802a, 802b with a common sink location at the heatsink 808. In a particular example, the example laser diode package 800 can produce a total of 1400 W fiber-coupled optical power in a two output optical fibers 810a, 810b in a total volume of 220 cm³, resulting in about 0.16 cm³/W. With additional reference to FIG. 9, by using three laser diode packages 800, a multi-package arrangement 900 can be formed. A 6+1:1 fiber combiner 902 can be situated to receive and combine the outputs of six optical output fibers 904a-904f provided by the three dual-base packages 906a-906c, producing a total of 4080 W of fiber-coupled optical pump power that can be deployed in various applications, such as into a 400 μm and 0.46 NA double-clad fiber amplifier 908 to produce greater than 3 kW of single mode output. In representative examples, the one or both of the base surfaces 804a, 804b can form a seal for a cooling chamber of the heatsink 808 of the two-phase cooling unit.

FIGS. 10A-10E depict a laser diode package 1000 that includes a conductive base 1002 that includes a plurality of planar stepped mounting surfaces 1004a-1004g. A plurality of stepped mounting blocks 1006a-1006e, 1008a-1008e each include laser diodes 1010 on respective stepped surfaces 1012 and are mounted to the respective mounting surfaces 1004b-1004f. The laser diodes 1010 emit respective beams 1012 that are received by collimation and turning optics 1014 to form turned beam stacks 1016a, 1016b. The turned beam stacks 1016a, 1016b are combined and turned with a polarization multiplexer 1018 to form a combined beam stack 1020. Light from the turned beam stacks 1016a, 1016b that is not turned and/or combined with the polarization multiplexer 1018 can be received by an optical absorber 1022 that is coupled to the conductive base 1002 with a mounting bracket 1024 on mounting surface 1004a. Electrodes 1026a, 1026b can be affixed to respective standoffs 1028a, 1028b and mounted to the mounting surface 1004a, and a bus bar 1030 can be secured to the mounting surface 1004g. In some examples, the bus bar 1030 can be coupled to selected stepped surfaces 1012 of opposing laser diode mounting blocks (e.g., 1006e, 1008e). The combined beam stack 1020 is turned with a turning mirror 1032 and coupled into an optical fiber 1034 with a fast axis telescope 1036 and focusing objective 1038, with the focusing objective 1038 and optical fiber 1034 secured in relation to each other in a fiber termination housing 1040.

The conductive base 1002 is secured to a cooling block 1042 that is part of a two-phase cooling unit 1043. The two-phase cooling unit 1043 typically includes various other cooling unit components including one or more cooling pumps, condensers, temperature controllers, etc. The cooling block 1042 includes a coolant inlet 1044a and coolant outlet 1044b in communication with a cooling chamber 1046. Liquid coolant from the two-phase cooling unit 1043 is typically near a saturation point where boiling occurs. The cooling chamber 1046 provides a volume through which coolant can flow for active cooling of the laser diodes 1010. A plurality of finned heat exchanger elements 1048a-1048c are situated in the cooling chamber 1046 to increase cooling efficiency so that the liquid coolant near saturation boils with the heat generated by the laser diodes 1010 and stores the generated heat in the latent heat of the phase transition. In some examples, one or more thermistors or other thermal detectors can be coupled to the conductive base 1002 or other components of the laser diode package 1000 (typically proximate the laser diodes 1010 such as in or near chip-on-submount members), and the two-phase cooling unit 1043 can provide closed-loop feedback based on a temperature setpoint.

In representative examples, the cooling chamber 1046 and finned heat exchanger elements 1048a-1048c form an evaporator of the two-phase cooling unit 1043. An opening 1050 of the cooling chamber is covered by a base surface 1052 of the conductive base 1002 that is opposite the mounting surfaces 1004a-1004g. The base surface 1052 is secured to a coupling surface 1054 of the cooling block 1042 along selected areas, typically by brazing. Post members 1056a-1056c can be used to register and/or align the conductive base 1002 in a predetermined position on the cooling block 1042 for optical alignment. A common thermal distance can be provided for each of the laser diodes 1010 with respect to the base surface 1052 and adjoining cooling chamber 1046 with the slope of the stepped surfaces 1112 generally parallel to the base surface 1052. The cooling block 1042 can include a platform extension 1058 that includes angled planar surfaces 1060a-1060c for receiving the turning mirror 1032, the fast axis telescope 1036, and the fiber termination housing 1040. In general, the angled planar surfaces 1060a-1060c are parallel to the stepped mounting surfaces 1004a-1004g and the stepped surfaces 1012. A lid 1062 can enclose the conductive base 1002 with mounted optical components and can also be registered in securing position in relation to the cooling block 1042 with the electrodes 1026a, 1026b secured to the respective standoffs 1028a, 1028b, with post member 1056a-1056d, and with the conductive base 1002 secured to the cooling block 1042.

Figure 11A:
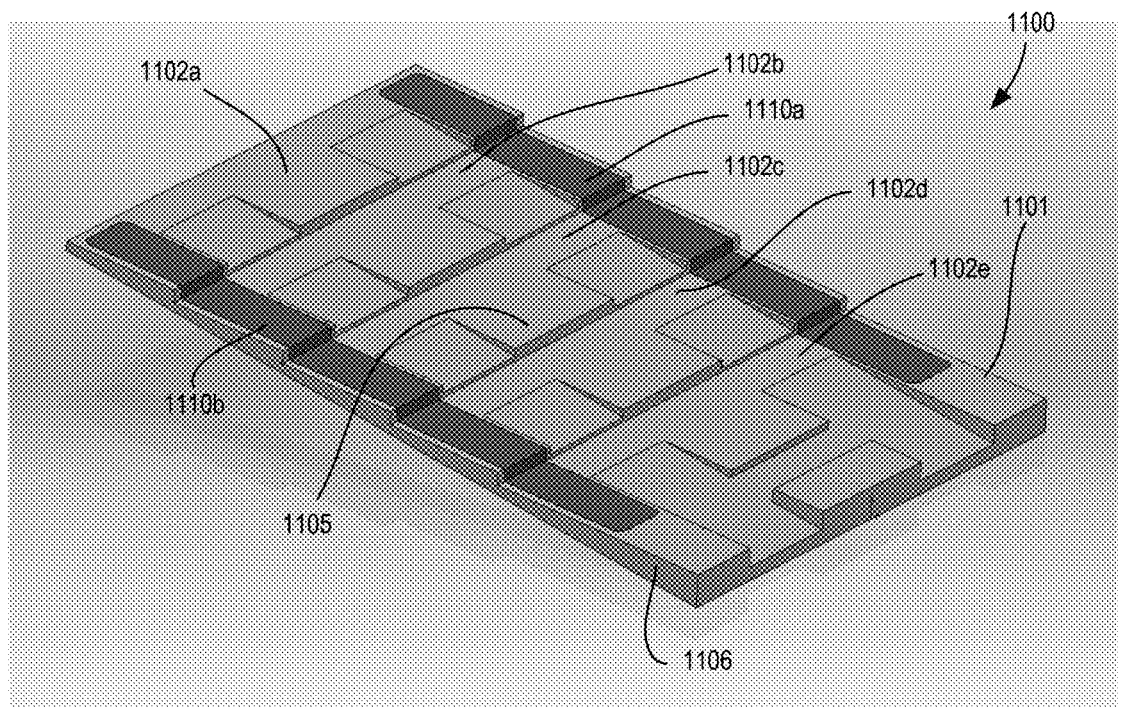
FIGS. 11A-11B are perspective views of an example conductive base with removable inserts.
Figure 11B:
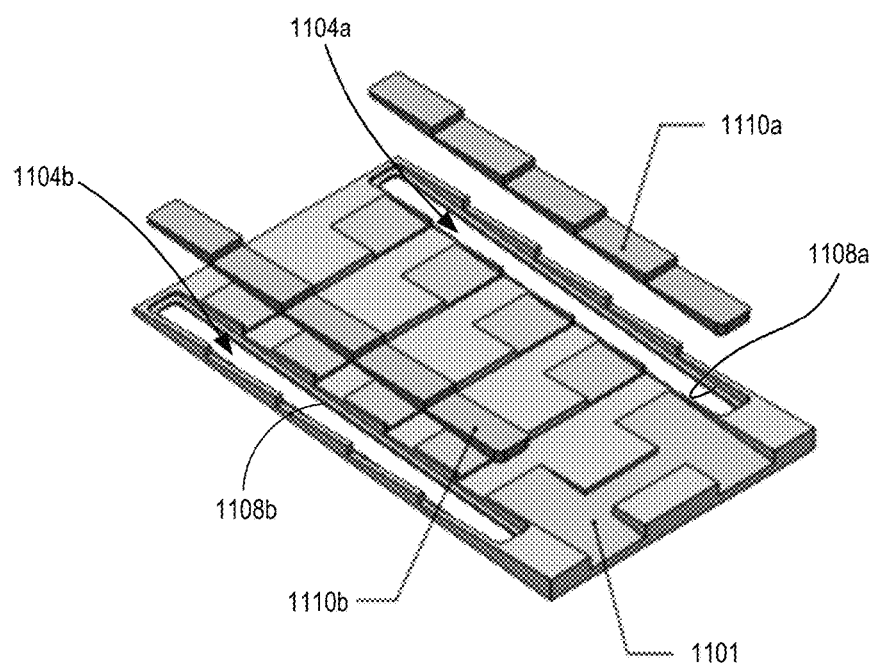

FIGS. 11A-11B show an example of a conductive base 1100 that can be used to thermally couple heat generated by laser diodes to a heatsink. In representative examples, the conductive base 1100 includes a conductive main body 1101 including a plurality of parallel stepped mounting surfaces 1102a-1102f defining a laser diode package interior surface 1104 situated to receive various optical components. Holes 1104a, 1104b near opposite sides of the interior surface 1105 where laser diode mounting blocks are to be situated extend between the interior surface 1104 to a base surface 1106 that is directly coupled to a heatsink. Lips 1108a, 1108b proximate the base surface 1106 in each hole 1104, 1104b are situated to support removable thermally conductive inserts 1110a, 1110b that can be brazed or otherwise secured to the respective lips 1108a, 1108b and/or the conductive main body 1101 in the respective holes 1110a, 1110b. In representative examples, the conductive main body 1101 is made of aluminum and the inserts 1110a, 1110b are made of copper. The inserts 1110a, 1110b typically include a plurality of parallel stepped surfaces 1112a-1112e, 1114a-1114e that can be co-planar with respective parallel stepped mounting surfaces 1102a-1102e of the conductive main body 1101. When secured to the conductive main body 1101, the inserts 1110a, 1110b can also form a seal for a cooling chamber in some examples so as to directly couple the conductive base 1100 to the heatsink.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of apparatus described herein may be combined in function and use. We therefore claim all that comes within the scope of the appended claims.

We claim:

1. An apparatus, comprising:
a conductive block including a base surface and a plurality of parallel stepped surfaces opposite the base surface and defining respective mounting surfaces situated to receive respective laser diodes having respective thermal paths each defined by a distance from the respective mounting surface to the base surface, wherein each distance is equal to each other distance; and
a two-phase cooling unit including a coupling surface attached to the base surface of the conductive block and wherein the two-phase cooling unit is situated to conduct heat generated through the emission of laser beams from the laser diodes along the thermal paths;
wherein the laser diodes on the mounting surfaces emit the laser beams along respective parallel emission axes in a common direction and a common plane that is parallel to the base surface;
wherein the conductive block includes a plurality of stepped mounting block surfaces situated to receive respective stepped mounting blocks, each stepped mounting block including a plurality of the parallel stepped surfaces.

2. The apparatus of claim 1, wherein the mounting surfaces are situated at a first edge of the conductive block and the common direction is away from the first edge towards a second edge opposite the first edge.

3. The apparatus of claim 1, wherein the base surface forms a sealing surface of an opening in a cooling chamber of the two-phase cooling unit and the heat is conducted directly to the cooling chamber through the base surface.

4. The apparatus of claim 1, wherein the coupling surface is attached to the base surface along one or more of the thermal paths.

5. The apparatus of claim 2, wherein the plurality of parallel stepped surfaces correspond to a first plurality and wherein the conductive block include a second plurality of the parallel stepped surfaces that is situated at the second edge and the common direction associated with the second plurality is away from the second edge and opposite the common direction associated with the first plurality.

6. The apparatus of claim 1, wherein the conductive block is a first conductive block, and the coupling surface is a first coupling surface, the apparatus further comprising:
a second conductive block including a base surface and a plurality of parallel stepped surfaces opposite the base surface and defining respective mounting surfaces situated to receive respective laser diodes having respective thermal paths defining a common thermal path distance from the mounting surfaces to the base surface;
wherein the base surface of the second conductive block is attached to a second coupling surface of the two-phase cooling unit that is opposite the first coupling surface.

7. The apparatus of claim 1, wherein the conductive block is made of first conductive material and includes a removable insert made of a second conductive material that is more conductive than the first conductive material and that is situated along the thermal paths.

8. The apparatus of claim 7, wherein the first conductive material is aluminum and the second conductive material is copper.

9. The apparatus of claim 1, wherein the laser beams have fast axes and slow axes mutually perpendicular to each other and to the emission axes, wherein the fast axes correspond to a fast beam divergence associated with a thickness of an emission region of the laser diodes in a corresponding semiconductor growth direction.

10. The apparatus of claim 9, further comprising a plurality of groups of slow axis collimators and turning mirrors, each group situated on a respective surface parallel or common to a respective one of the mounting block surfaces, wherein the turning mirrors are situated to reflect the laser beams into a common stack propagation direction having the emission axes and the fast axes forming a common stacking plane.

11. The apparatus of claim 10, further comprising:
an optical fiber; and
coupling optics situated to receive the laser beams from the common stack propagation direction and to couple the laser beams into an end of the optical fiber.

12. The apparatus of claim 11, wherein an NA of the optical fiber is underfilled with respect to the NA of the laser beams directed into the end of the optical fiber such that the end of the optical fiber and a fiber termination housing that surrounds the end of the optical fiber are not directly coupled to a cooling channel of the two-phase cooling unit.

13. The apparatus of claim 11, wherein an optical axis of the optical fiber is situated at an oblique angle with respect to the base surface corresponding to an angle between the parallel stepped surfaces and the base surface.

14. The apparatus of claim 1, wherein the equal distances correspond to a thermal resistance of 1.5° C./W or smaller.

15. The apparatus of claim 1, wherein the base surface and coupling surface form a brazed attachment.

16. The apparatus of claim 1, wherein the apparatus comprises a laser diode package having a volume/power ratio of 0.4 $cm^3$/W or smaller, a mass/power ratio 0.5 g/W or smaller, and a fiber-coupled output power of 500 W or greater.

17. The apparatus of claim 16, wherein the volume/power ratio is 0.2 $cm^3$/W or smaller and the fiber-coupled output power is at least 1000 W.

18. An apparatus, comprising:
a plurality of laser diode packages, each comprising the apparatus of claim 1;
a fused fiber combiner situated to combine fiber-coupled outputs of the laser diode packages.

19. The apparatus of claim 1, further comprising a lid attached to the two-phase cooling unit and situated to enclose the laser diodes and the plurality of parallel stepped surfaces of the conductive block.

20. An apparatus, comprising:
a conductive block including a base surface and a plurality of parallel stepped surfaces opposite the base surface and defining respective mounting surfaces situated to receive respective laser diodes having respective thermal paths defining a common thermal path distance from the mounting surfaces to the base surface; and
a two-phase cooling unit including a coupling surface attached to the base surface of the conductive block and wherein the two-phase cooling unit is situated to conduct heat generated through the emission of laser beams from the laser diodes along the thermal paths;
wherein the laser diodes on the mounting surfaces emit the laser beams along respective parallel emission axes in a common direction and a common plane that is parallel to the base surface;
wherein the conductive block includes a plurality of stepped mounting block surfaces situated to receive respective stepped mounting blocks, each stepped mounting block including a plurality of the parallel stepped surfaces.

21. An apparatus, comprising:
a conductive block including a base surface and a plurality of parallel stepped surfaces opposite the base surface and defining respective mounting surfaces situated to receive respective laser diodes having respective thermal paths defining a common thermal path distance from the mounting surfaces to the base surface; and
a two-phase cooling unit including a coupling surface attached to the base surface of the conductive block and wherein the two-phase cooling unit is situated to conduct heat generated through the emission of laser beams from the laser diodes along the thermal paths, wherein the laser diodes on the mounting surfaces emit the laser beams along respective parallel emission axes in a common direction and a common plane that is parallel to the base surface, wherein the laser beams have fast axes and slow axes mutually perpendicular to each other and to the emission axes, wherein the fast axes correspond to a fast beam divergence associated with a thickness of an emission region of the laser diodes in a corresponding semiconductor growth direction;
a plurality of groups of slow axis collimators and turning mirrors, each group situated on a respective surface parallel or common to a respective one of the mounting block surfaces, wherein the turning mirrors are situated to reflect the laser beams into a common stack propagation direction having the emission axes and the fast axes forming a common stacking plane;
an optical fiber; and
coupling optics situated to receive the laser beams from the common stack propagation direction and to couple the laser beams into an end of the optical fiber;
wherein an NA of the optical fiber is underfilled with respect to the NA of the laser beams directed into the end of the optical fiber such that the end of the optical fiber and a fiber termination housing that surrounds the end of the optical fiber are not directly coupled to a cooling channel of the two-phase cooling unit.

* * * * *